(12) United States Patent
Jeng et al.

(10) Patent No.: US 11,887,952 B2
(45) Date of Patent: *Jan. 30, 2024

(54) SEMICONDUCTOR DEVICE ENCAPSULATED BY MOLDING MATERIAL ATTACHED TO REDISTRIBUTION LAYER

(71) Applicant: TAIWAN SEMICONDUCTOR MANUFACTURING CO., LTD., Hsinchu (TW)

(72) Inventors: Shin-Puu Jeng, Hsinchu County (TW); Shuo-Mao Chen, New Taipei (TW); Feng-Cheng Hsu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/875,312

(22) Filed: Jul. 27, 2022

(65) Prior Publication Data

US 2022/0367395 A1 Nov. 17, 2022

Related U.S. Application Data

(63) Continuation of application No. 17/025,831, filed on Sep. 18, 2020, now Pat. No. 11,417,620, which is a
(Continued)

(51) Int. Cl.
*H01L 21/683* (2006.01)
*H01L 23/31* (2006.01)
(Continued)

(52) U.S. Cl.
CPC .......... *H01L 24/08* (2013.01); *H01L 21/6835* (2013.01); *H01L 23/3114* (2013.01);
(Continued)

(58) Field of Classification Search
CPC ... H01L 2924/181; H01L 25/50; H01L 25/05; H01L 25/0567; H01L 23/5389;
(Continued)

(56) References Cited

U.S. PATENT DOCUMENTS 8,022,523 B2 9/2011 Chen
8,174,109 B2 5/2012 Uchiyama
(Continued)

FOREIGN PATENT DOCUMENTS

CN 103000593 A 3/2013
CN 103531550 A 1/2014
(Continued)

*Primary Examiner* — Alonzo Chambliss
(74) *Attorney, Agent, or Firm* — Maschoff Brennan

(57) ABSTRACT

A package structure includes a first dielectric layer, a first semiconductor device over the first dielectric layer, a first redistribution line in the first dielectric layer, a second dielectric layer over the first semiconductor device, a second semiconductor device over the second dielectric layer, a second redistribution line in the second dielectric layer, a conductive through-via over the first dielectric layer and electrically connected to the first redistribution line, a conductive ball over the conductive through-via and electrically connected to the second redistribution line, and a molding material. The molding material surrounds the first semiconductor device, the conductive through-via, and the conductive ball, wherein a top of the conductive ball is higher than a top of the molding material.

20 Claims, 39 Drawing Sheets

Related U.S. Application Data continuation of application No. 15/800,035, filed on Oct. 31, 2017, now Pat. No. 10,784,220.

(60) Provisional application No. 62/479,237, filed on Mar. 30, 2017.

(51) Int. Cl.
| | | |
|---|---|---|
| *H01L 23/48* | (2006.01) | |
| *H01L 25/065* | (2023.01) | |
| *H01L 23/498* | (2006.01) | |
| *H01L 23/538* | (2006.01) | |
| *H01L 23/00* | (2006.01) | |
| *H01L 25/00* | (2006.01) | |
| *H01L 25/10* | (2006.01) | |
| *H01L 21/56* | (2006.01) | |

(52) U.S. Cl.
CPC ............ *H01L 23/481* (2013.01); *H01L 24/05* (2013.01); *H01L 24/11* (2013.01); *H01L 24/14* (2013.01); *H01L 24/17* (2013.01); *H01L 24/19* (2013.01); *H01L 24/20* (2013.01); *H01L 24/81* (2013.01); *H01L 25/0655* (2013.01); *H01L 25/0657* (2013.01); *H01L 25/105* (2013.01); *H01L 25/50* (2013.01); *H01L 21/561* (2013.01); *H01L 21/568* (2013.01); *H01L 23/3128* (2013.01); *H01L 23/49816* (2013.01); *H01L 23/5383* (2013.01); *H01L 23/5389* (2013.01); *H01L 24/13* (2013.01); *H01L 24/16* (2013.01); *H01L 24/29* (2013.01); *H01L 24/32* (2013.01); *H01L 24/73* (2013.01); *H01L 2221/68331* (2013.01); *H01L 2221/68345* (2013.01); *H01L 2224/02145* (2013.01); *H01L 2224/04105* (2013.01); *H01L 2224/12105* (2013.01); *H01L 2224/13101* (2013.01); *H01L 2224/13144* (2013.01); *H01L 2224/13147* (2013.01); *H01L 2224/13164* (2013.01); *H01L 2224/13644* (2013.01); *H01L 2224/13655* (2013.01); *H01L 2224/13664* (2013.01); *H01L 2224/16225* (2013.01); *H01L 2224/18* (2013.01); *H01L 2224/24137* (2013.01); *H01L 2224/2919* (2013.01); *H01L 2224/32225* (2013.01); *H01L 2224/73204* (2013.01); *H01L 2224/73267* (2013.01); *H01L 2224/92244* (2013.01); *H01L 2225/1058* (2013.01); *H01L 2924/1203* (2013.01); *H01L 2924/1304* (2013.01); *H01L 2924/1432* (2013.01); *H01L 2924/1436* (2013.01); *H01L 2924/1461* (2013.01); *H01L 2924/15192* (2013.01); *H01L 2924/15311* (2013.01); *H01L 2924/15331* (2013.01); *H01L 2924/181* (2013.01); *H01L 2924/18161* (2013.01); *H01L 2924/19011* (2013.01); *H01L 2924/19105* (2013.01); *H01L 2924/3511* (2013.01)

(58) Field of Classification Search
CPC ............ H01L 23/3114; H01L 23/3128; H01L 23/481; H01L 24/19; H01L 24/81; H01L 24/07; H01L 24/14; H01L 24/08; H01L 24/05; H01L 24/11; H01L 24/13

See application file for complete search history.

(56) References Cited

U.S. PATENT DOCUMENTS

| | | | |
|---|---|---|---|
| 8,193,604 B2 | 6/2012 | Lin | |
| 8,193,624 B1 | 6/2012 | Sohn | |
| 8,786,103 B2 | 7/2014 | Uchiyama | |
| 8,975,726 B2 | 3/2015 | Chen | |
| 8,980,691 B2 | 3/2015 | Lin | |
| 9,000,584 B2 | 4/2015 | Lin | |
| 9,048,222 B2 | 6/2015 | Hung | |
| 9,048,233 B2 | 6/2015 | Wu | |
| 9,064,879 B2 | 6/2015 | Hung | |
| 9,111,949 B2 | 8/2015 | Yu | |
| 9,263,511 B2 | 2/2016 | Yu | |
| 9,281,254 B2 | 3/2016 | Yu | |
| 9,368,460 B2 | 6/2016 | Yu | |
| 9,372,206 B2 | 6/2016 | Wu | |
| 9,496,189 B2 | 11/2016 | Yu | |
| 9,515,050 B2 | 12/2016 | Uchiyama | |
| 9,831,224 B2 | 11/2017 | Lin | |
| 9,997,471 B2 | 6/2018 | Hung | |
| 10,032,704 B2 | 7/2018 | Chen | |
| 10,170,409 B2 | 1/2019 | Ganesan | |
| 10,784,220 B2 | 9/2020 | Jeng | |
| 11,417,620 B2 * | 8/2022 | Jeng ........................ H01L 24/24 |
| 2006/0255458 A1 | 11/2006 | Dangelmaier | |
| 2008/0036065 A1 | 2/2008 | Brunnbauer | |
| 2008/0169550 A1 | 7/2008 | Kurita | |
| 2010/0213616 A1 | 8/2010 | Uchiyama | |
| 2010/0252937 A1 | 10/2010 | Uchiyama | |
| 2012/0223426 A9 | 9/2012 | Shim | |
| 2012/0280404 A1 | 11/2012 | Kwon | |
| 2013/0062761 A1 | 3/2013 | Lin et al. | |
| 2013/0249106 A1 | 9/2013 | Lin | |
| 2014/0035892 A1 | 2/2014 | Shenoy et al. | |
| 2014/0203443 A1 | 7/2014 | Pagaila | |
| 2014/0264811 A1 | 9/2014 | Wu | |
| 2015/0187742 A1 * | 7/2015 | Kwon ..................... H01L 24/24 |
| | | | 438/126 |
| 2015/0200185 A1 | 7/2015 | Yu | |
| 2015/0255447 A1 | 9/2015 | Hung | |
| 2016/0043047 A1 | 2/2016 | Shim | |
| 2016/0049363 A1 | 2/2016 | Cheng et al. | |
| 2016/0099231 A1 * | 4/2016 | Yang ................... H01L 23/3171 |
| | | | 257/774 |
| 2016/0141227 A1 | 5/2016 | Lin | |
| 2016/0240457 A1 | 8/2016 | Lee | |
| 2016/0265334 A1 | 9/2016 | Dykstra et al. | |
| 2016/0358865 A1 | 12/2016 | Shih et al. | |
| 2017/0141043 A1 * | 5/2017 | Park ....................... H01L 24/20 |
| 2018/0158789 A1 | 6/2018 | Yu et al. | |

FOREIGN PATENT DOCUMENTS

| | | |
|---|---|---|
| CN | 104520990 A | 4/2015 |
| CN | 105225965 A | 1/2016 |
| CN | 105895599 A | 8/2016 |
| CN | 106252299 A | 12/2016 |
| CN | 106252324 A | 12/2016 |

* cited by examiner

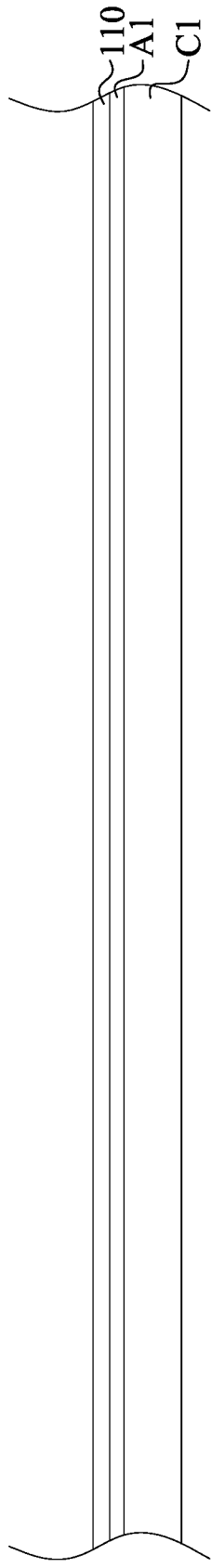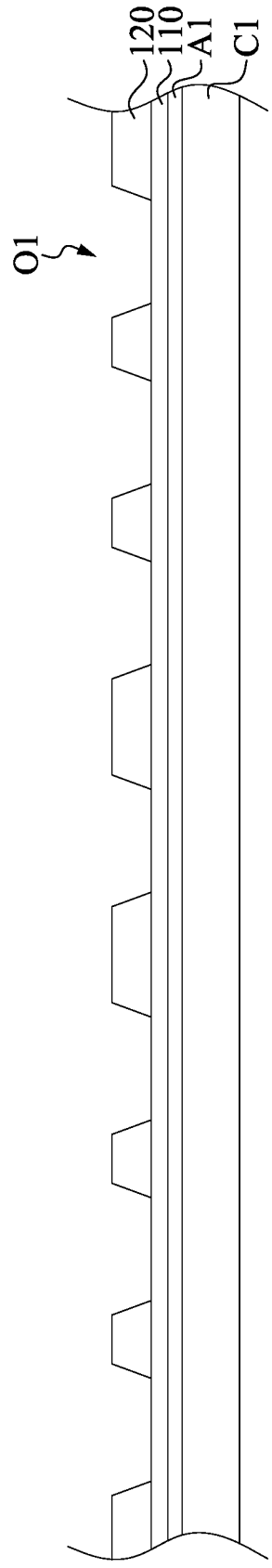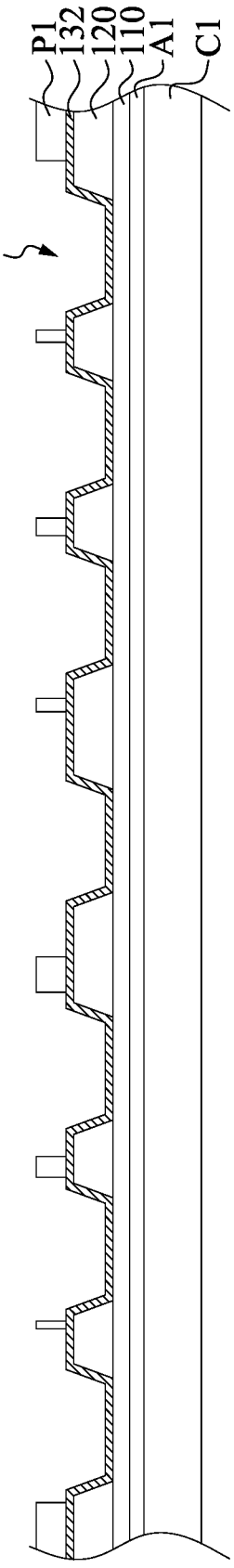

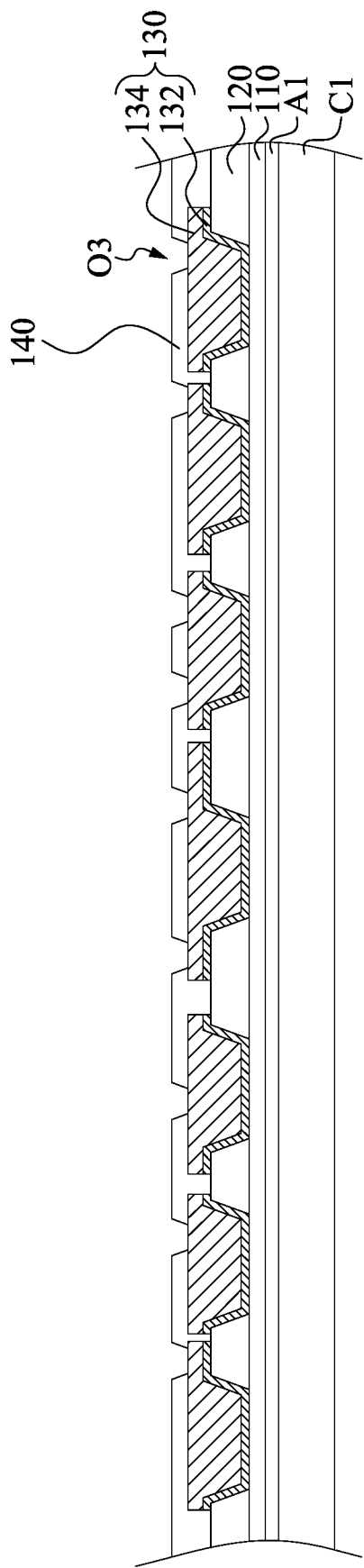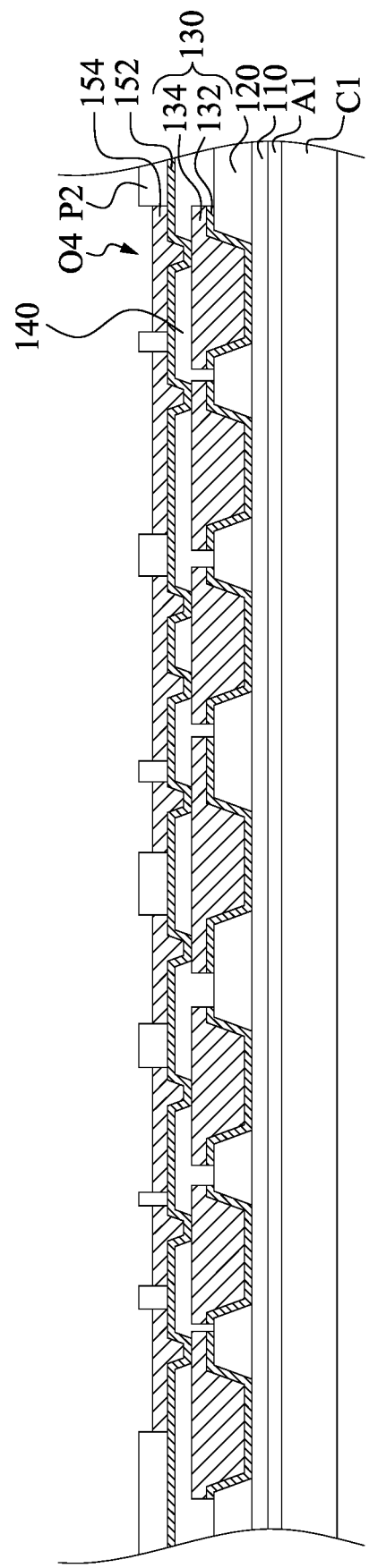
Fig. 6
Fig. 7

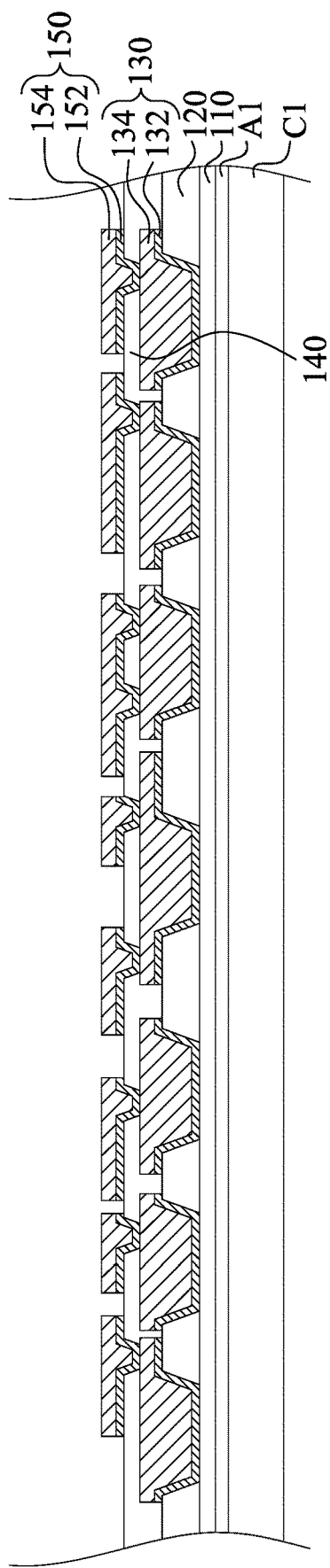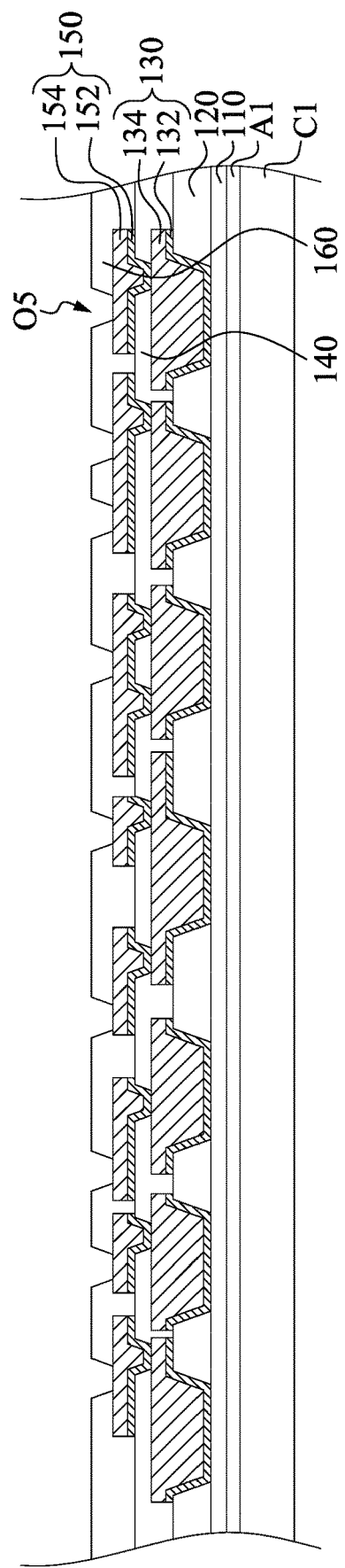
Fig. 8
Fig. 9

SEMICONDUCTOR DEVICE ENCAPSULATED BY MOLDING MATERIAL ATTACHED TO REDISTRIBUTION LAYER

PRIORITY CLAIM AND CROSS-REFERENCE

This present application is a continuation application of U.S. patent application Ser. No. 17/025,831, filed Sep. 18, 2020, which is a continuation application of U.S. patent application Ser. No. 15/800,035, filed Oct. 31, 2017, now U.S. Pat. No. 10,784,220, issued Sep. 22, 2020, which claims priority to U.S. Provisional Application Ser. No. 62/479,237, filed Mar. 30, 2017, all of which are herein incorporated by reference in their entirety.

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. Some smaller types of packaging for semiconductors include quad flat pack (QFP), pin grid array (PGA), ball grid array (BGA), flip chips (FC), three dimensional integrated circuits (3DICs), wafer level packages (WLPs), bond-on-trace (BOT) packages, and package on package (PoP) structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-19 are cross-sectional views of intermediate stages in the manufacturing of a package structure in accordance with some embodiments of the present disclosure;

DETAILED DESCRIPTION

Figure 4:
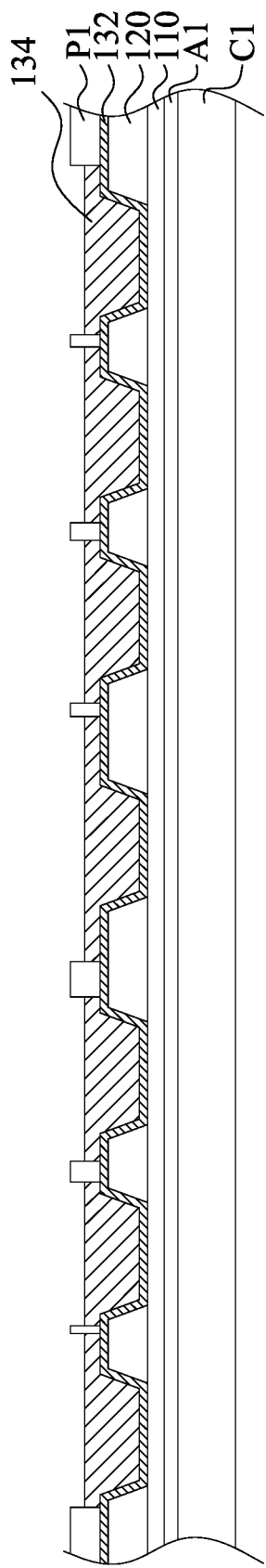

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1-19 are cross-sectional views of intermediate stages in the manufacturing of a package structure in accordance with some embodiments of the present disclosure. Reference is made to FIG. 1. An adhesive layer A1 is formed on a carrier C1. The carrier C1 may be a blank glass carrier, a blank ceramic carrier, a metal frame, or the like. The adhesive layer A1 may be made of an adhesive, such as ultra-violet (UV) glue, light-to-heat conversion (LTHC) glue, or the like, although other types of adhesives may be used. A buffer layer 110 is formed over the adhesive layer A1 using a spin coating process, a film lamination process, or a deposition process, as examples. The buffer layer 110 is a dielectric layer which may be a polymer layer. The polymer layer may include, for example, polyimide, polybenzoxazole (PBO), benzocyclobutene (BCB), an ajinomoto buildup film (ABF), a solder resist film (SR), or the like. In some embodiments, the buffer layer 110 may be a composite layer that combines the buffer layer 110 with the adhesive layer A1 into one layer. The buffer layer 110 may be a substantially planar layer having a substantially uniform thickness, in which the thickness may be greater than about 2 μm or may be in a range from about 0.5 μm to about 40 μm. In some embodiments, top and bottom surfaces of the buffer layer 110 are also substantially planar.

Reference is made to FIG. 2. A dielectric layer 120 is formed over the buffer layer 110 using a spin coating process or a lamination process, as examples. Thereafter, the dielectric layer 120 is patterned to form openings O1. The openings O1 may be arranged in a grid pattern of rows and columns that corresponds to a subsequently formed ball grid array (BGA). The dielectric layer 120 may be patterned using a lithography process. In some embodiments, the dielectric layer 120 may be a polymer layer. The polymer layer may include, for example, polyimide, polybenzoxazole (PBO), benzocyclobutene (BCB), an ajinomoto buildup film (ABF), a solder resist film (SR), or the like.

Reference is made to FIG. 3. A seed layer 132 is formed over the carrier C1. The seed layer 132 is formed over the buffer layer 110 and the dielectric layer 120 on the carrier C1. The seed layer 132 includes, for example, titanium (Ti), copper (Cu), or a combination thereof and is deposited using physical vapor deposition (PVD) or by lamination of a foil material in some embodiments, for example. Alternatively, the seed layer 132 may include other materials and dimensions and may be formed using other methods. Thereafter, a photoresist P1 is applied over the seed layer 132 and is then patterned. As a result, openings O2 are formed in the photoresist P1 through which some portions of the seed layer 132 are exposed.

Reference is made to FIG. 4. Conductors 134 are respectively formed in the openings O2 of the photoresist P1 through plating which may be electro plating or electro-less plating. The conductors 134 are plated on the exposed portions of the seed layer 132. The conductors 134 may include a metal or a metal alloy including aluminum, copper, tungsten, and/or alloys thereof. After the plating of the conductors 134, the photoresist P1 is removed to expose some portions of the seed layer 132.

Figure 5:
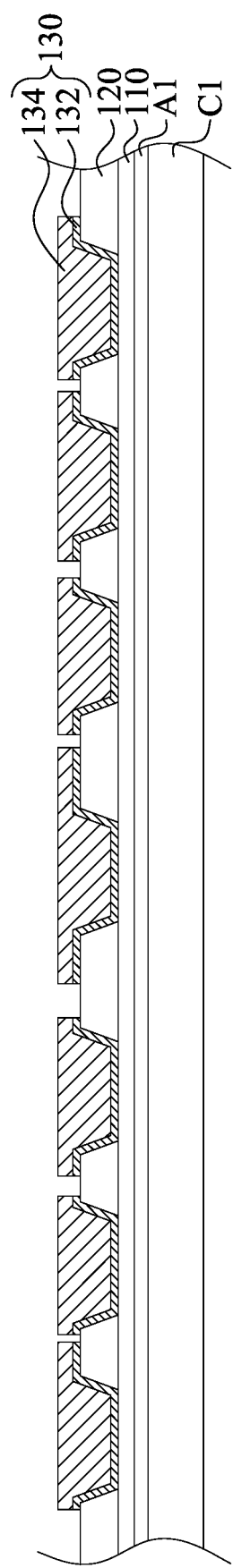

Reference is made to FIG. 5. An etch operation is performed to remove the exposed portions of the seed layer 132, and the etch operation may include an anisotropic etching. Some portions of the seed layer 132 that are covered by the conductors 134, on the other hand, remain not etched. Throughout the description, the conductors 134 and the remaining underlying portions of the seed layer 132 are in combination referred to as redistribution lines (RDLs) 130. Although the seed layer 132 is shown as a layer separate from the conductors 134, when the seed layer 132 is made of a material similar to or substantially the same as the respective overlying conductors 134, the seed layer 132 may be merged with the conductors 134 with no distinguishable interface therebetween. In alternative embodiments, there exist distinguishable interfaces between the seed layer 132 and the overlying conductors 134.

Reference is made to FIG. 6. A dielectric layer 140 is formed over the RDLs 130. The dielectric layer 140 may include a polymer, such as polyimide, benzocyclobutene (BCB), polybenzoxazole (PBO), or the like, which is deposited using a spin coating process or a lamination process, as examples. Alternatively, the dielectric layer 140 may include non-organic dielectric materials, such as silicon oxide, silicon nitride, silicon carbide, silicon oxynitride, or the like.

The dielectric layer 140 is patterned using a lithography process. For example, a photoresist (not shown) may be formed over the dielectric layer 140, and the photoresist is patterned by exposure to energy or light reflect from or transmitted through a lithography mask having a predetermined pattern thereon. The photoresist is developed, and exposed (or unexposed, depending on whether the photoresist is positive or negative) regions of the photoresist are removed using an ashing and/or etching process. The photoresist is then used as an etch mask during an etch process. Exposed portions of the dielectric layer 140 are removed during the etch process to form openings O3, through which some portions of the RDLs 130 are exposed. Afterwards, the photoresist is removed.

Reference is made to FIG. 7. A seed layer 152 is formed over the carrier C1. The seed layer 152 is formed over the dielectric layer 140 and in the openings O3 (shown in FIG. 6) of the dielectric layer 140. In some embodiments, the seed layer 152 is conformally formed on the dielectric layer 140 and in the openings O3 (shown in FIG. 6). The seed layer 152 includes, for example, titanium (Ti), copper (Cu), or a combination thereof and is deposited using PVD or by lamination of a foil material in some embodiments, for example. Alternatively, the seed layer 152 may include other materials and may be formed using other methods.

After the formation of the seed layer 152, a photoresist P2 is applied over the seed layer 152 and is then patterned. As a result, openings O4 are formed in the photoresist P2 through which some portions of the seed layer 152 are exposed. The photoresist P2 is patterned using lithography to define the pattern for conductors 154 formed in a subsequent step. The conductors 154 are respectively formed in the openings O4 of the photoresist P2 through, for example, plating which may be electro plating or electro-less plating. The conductors 154 are plated on the exposed portions of the seed layer 152. The conductors 154 may include a metal or a metal alloy including aluminum, copper, tungsten, and/or alloys thereof.

After the plating of the conductors 154, the photoresist P2 is removed, and some portions of the seed layer 152 are exposed. An etch step can be performed to remove the exposed portions of the seed layer 152, and the etch step may include an anisotropic etching. Some portions of the seed layer 152 that are covered by the conductors 154, on the other hand, remain not etched, and the resulting structure is shown in FIG. 8. The conductors 154 and remaining portions of the seed layer 152 can be collectively referred to as redistribution lines (RDLs) 150. Although the seed layer 152 is shown as a layer separate from the conductors 154, when the seed layer 152 is made of a material similar to or substantially the same as the respective overlying conductors 154, the seed layer 152 may be merged with the conductors 154 with no distinguishable interface therebetween. In alternative embodiments, there exist distinguishable interfaces between the seed layer 152 and the overlying conductors 154.

Reference is made to FIG. 9. A dielectric layer 160 is formed over the RDLs 150 such that the RDLs 150 are embedded in the dielectric layer 160. The dielectric layer 160 may include a polymer, such as polyimide, benzocyclobutene (BCB), polybenzoxazole (PBO), or the like, and is deposited using a spin coating process or a lamination process, as examples. Alternatively, the dielectric layer 160 may include non-organic dielectric materials, such as silicon oxide, silicon nitride, silicon carbide, silicon oxynitride, or the like. The dielectric layer 160 is patterned using a lithography process. For example, a photoresist (not shown)

may be formed over the dielectric layer 160, and the photoresist is patterned by exposure to energy or light reflect from or transmitted through a lithography mask having a predetermined pattern thereon. The photoresist is developed, and exposed (or unexposed, depending on whether the photoresist is positive or negative) regions of the photoresist are removed using an ashing and/or etching process. The photoresist is then used as an etch mask during an etch process. Exposed portions of the dielectric layer 160 are removed during the etch process to form openings O5 through which some portions of the RDLs 150 are exposed.

Figure 10:
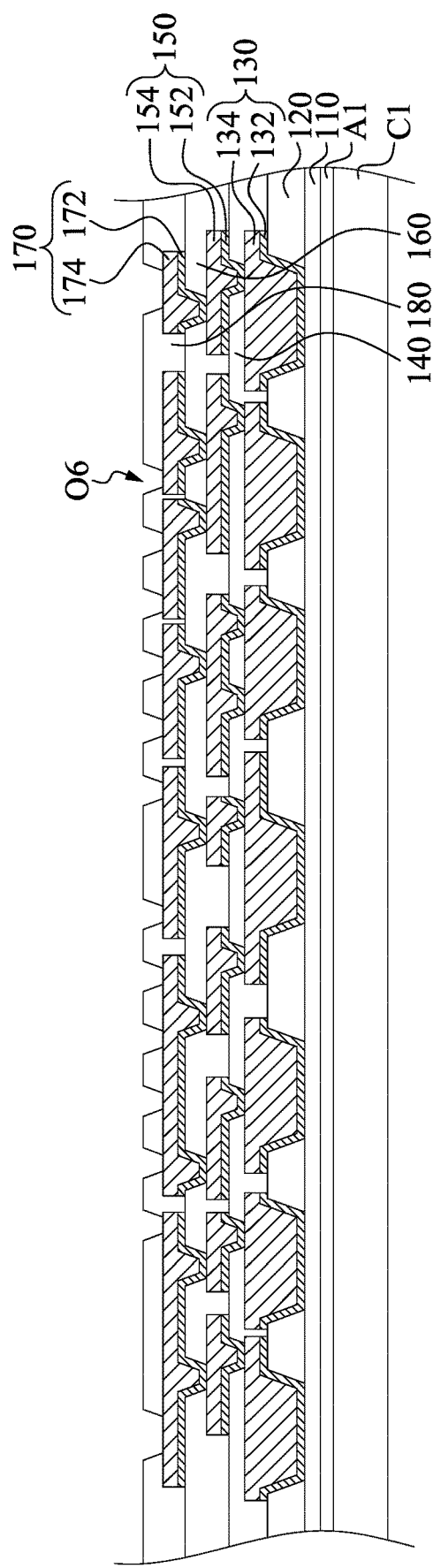

The number of layers of RDLs and the number of dielectric layers are not limited in various embodiments of the present disclosure. For example, after the structure of FIG. 9 is formed, another layer of RDLs 170 and another dielectric layer 180, as illustrated in FIG. 10, may be formed over the RDLs 150 and the dielectric layer 160 through steps as shown in FIGS. 6-9. In order to simplify the description, the steps for forming the RDLs 170 and the dielectric layer 180 will not described again.

Figure 11:
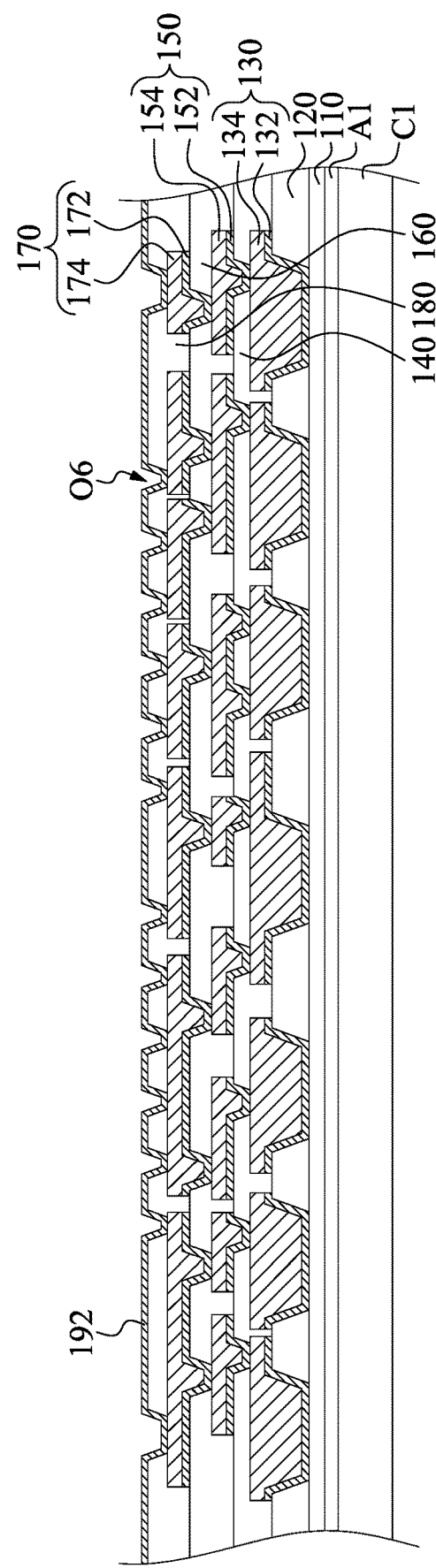

Reference is made to FIG. 10. The dielectric layer 180 is patterned to form openings O6 to expose some portions of the RDLs 170. Thereafter, a blanket seed layer 192 is formed over the dielectric layer 180 and the exposed RDLs 170, as illustrated in FIG. 11.

Figure 12:
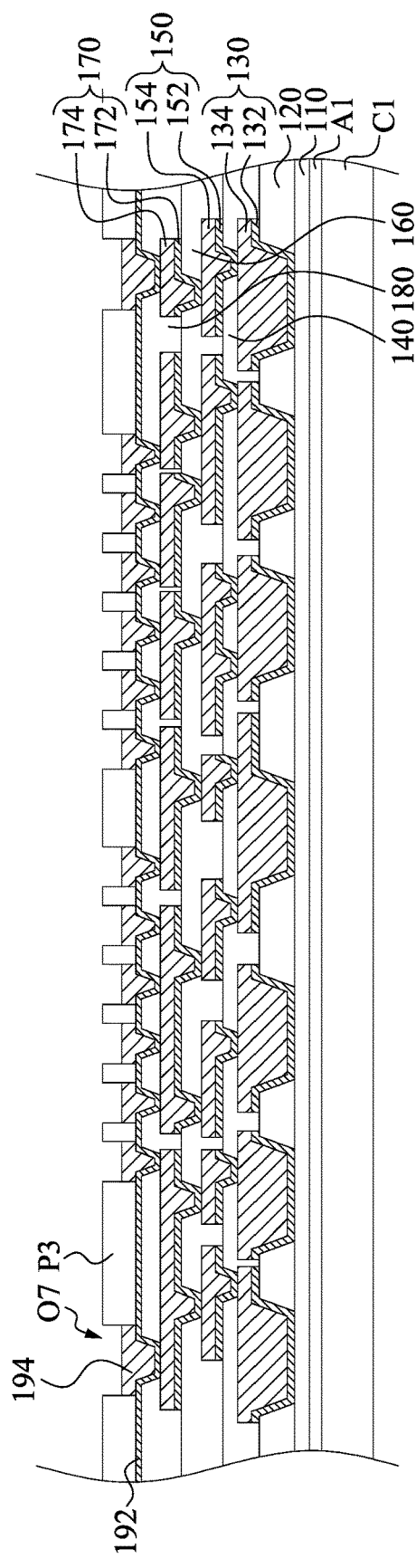

Reference is made to FIG. 12. A photoresist P3 is applied over the seed layer 192 and is then patterned. As a result, openings O7 are formed in the photoresist P3 through which some portions of the seed layer 192 are exposed. Afterwards, conductors 194 are respectively formed in the openings O7 of the photoresist P3 through plating which may be electro plating or electro-less plating. The conductors 194 are plated on the exposed portions of the seed layer 192. After the plating of the conductors 194, the photoresist P3 is removed to expose some portions of the seed layer 192.

Figure 13:
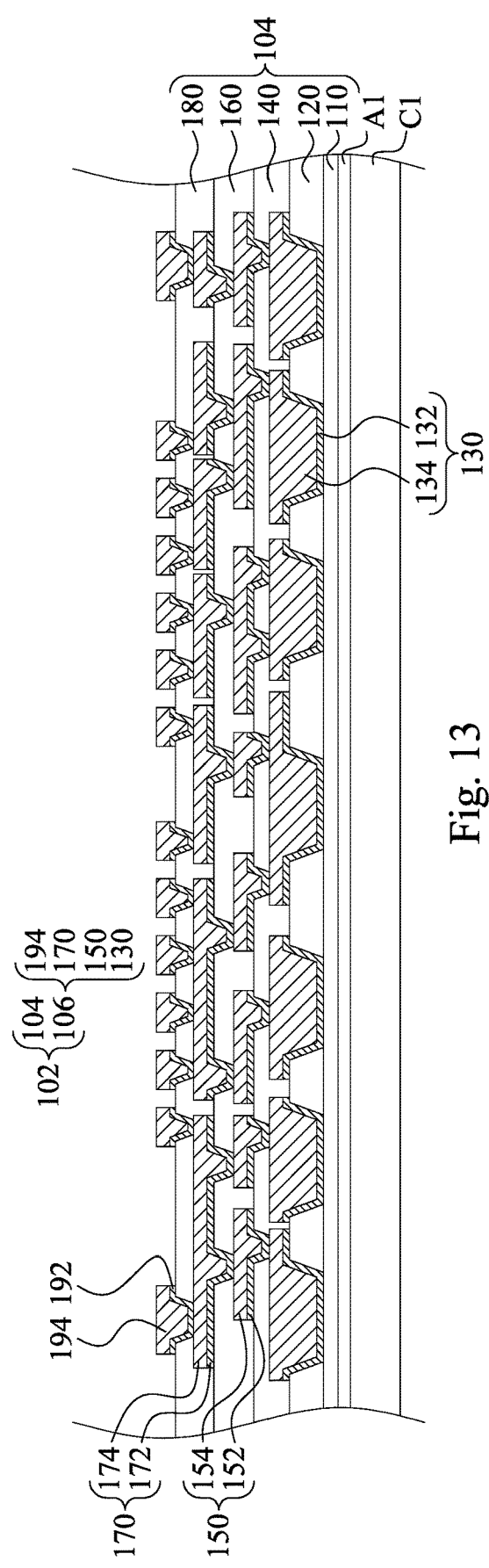

Reference is made to FIG. 13. An etch operation is performed to remove the exposed portions of the seed layer 192, and the etch operation may include an anisotropic etching. Some portions of the seed layer 192 that are covered by the conductors 194, on the other hand, remain not etched.

The buffer layer 110, the dielectric layer 120, the RDLs 130, the dielectric layer 140, the RDLs 150, the dielectric layer 160, the RDLs 170, the dielectric layer 180, the seed layer 192, and the conductors 194 can be collectively referred to as a redistribution structure 102. In some embodiments, the buffer layer 110, the dielectric layers 120, 140, 160, and 180 can be referred to as a dielectric structure 104 of the redistribution structure 102. The RDLs 130, 150, 170, the seed layer 192, and the conductors 194 can be referred to as a wiring structure 106 of the redistribution structure 102.

Figure 14:
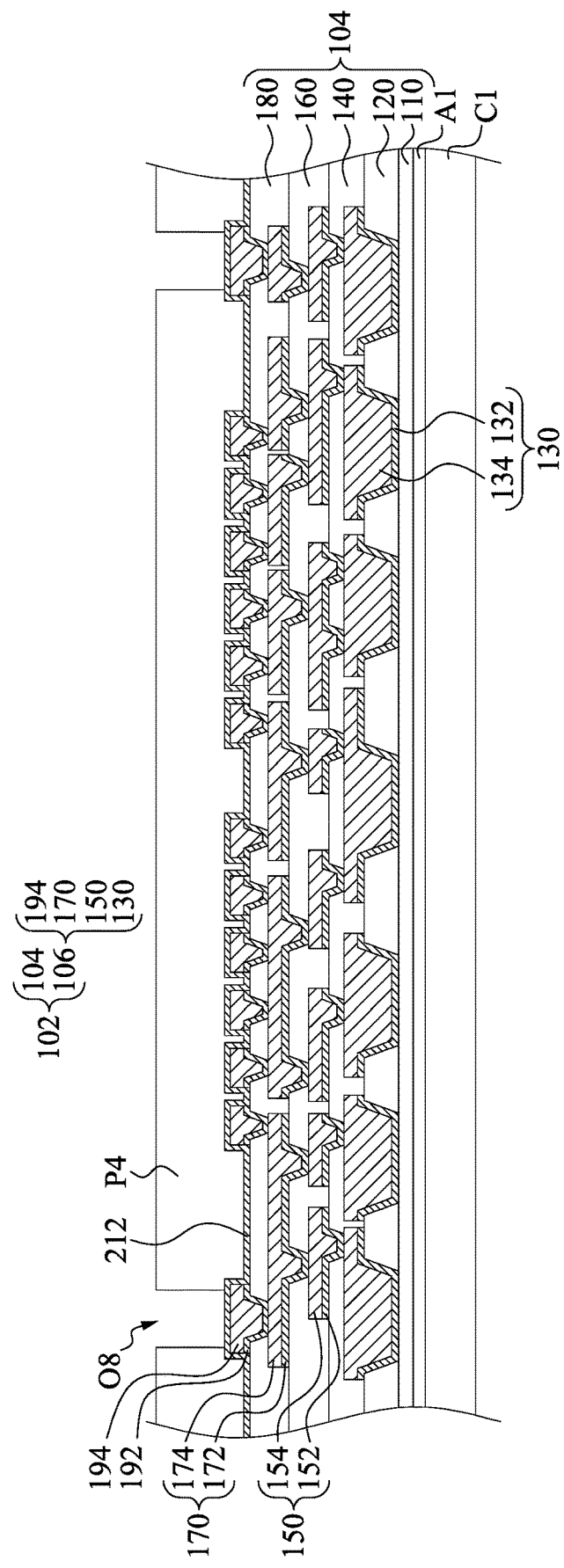

Reference is made to FIG. 14. A seed layer 212 is formed on the redistribution structure 102, for example, through PVD or metal foil laminating. The seed layer 212 may include copper, copper alloy, aluminum, titanium, titanium alloy, or combinations thereof. In some embodiments, the seed layer 212 includes a titanium layer and a copper layer over the titanium layer. In alternative embodiments, the seed layer 212 is a copper layer. Thereafter, a photoresist P4 is applied over the seed layer 212 and is then patterned to expose some portions of the seed layer 212. As a result, openings O8 are formed in the photoresist P4 through which some portions of the seed layer 212 are exposed.

Figure 15:
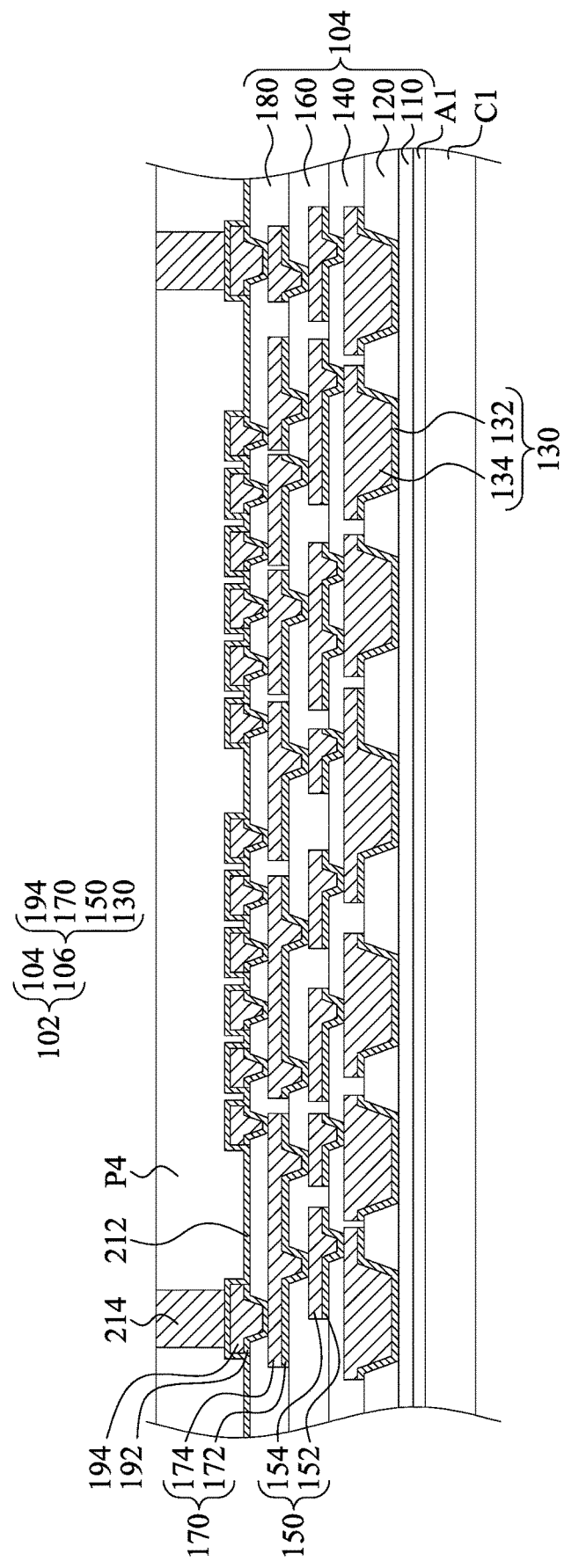

Reference is made to FIG. 15. Conductors 214 are respectively formed in the openings O8 of the photoresist P4 through, for example, plating which may be electro plating, electro-less plating, or metal-paste printing. The conductors 214 are plated on the exposed portions of the seed layer 212 underlying the openings O8, respectively. The conductors 214 may include copper, aluminum, tungsten, nickel, solder, silver or alloys thereof. Top-view shapes of the conductors 214 may be rectangles, squares, circles, or the like. After the plating of the conductors 214, the photoresist P4 is removed, and some portions of the seed layer 212 are exposed.

Figure 16:
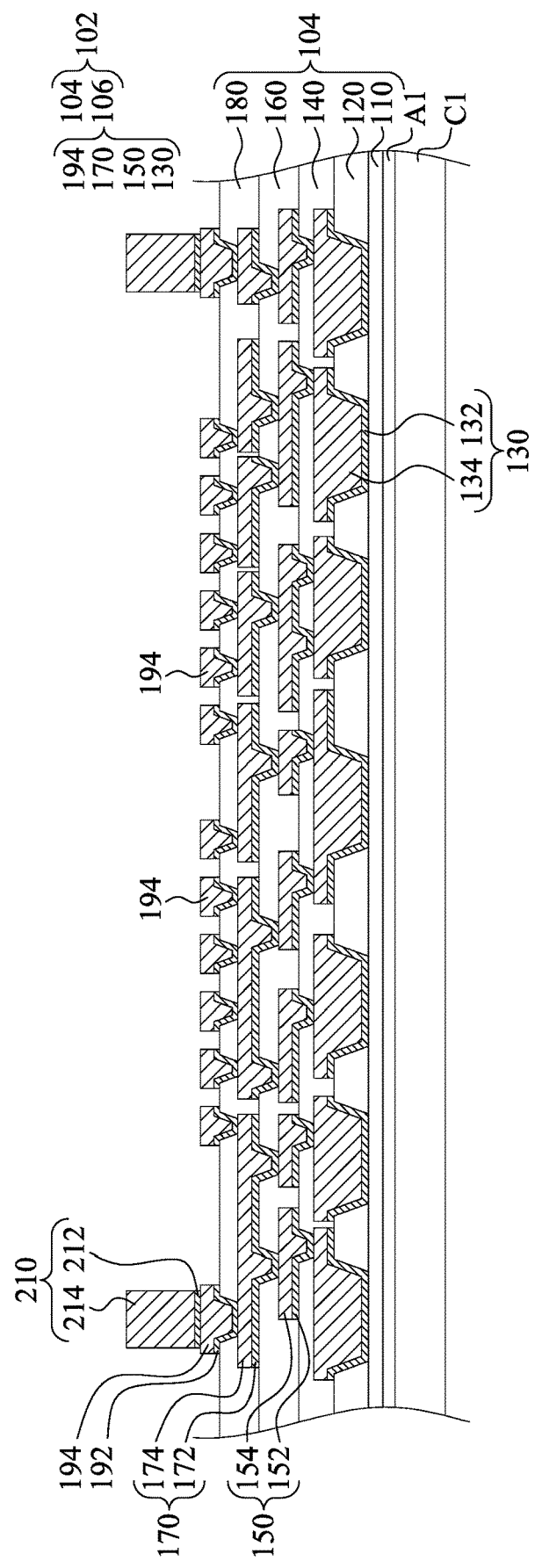

Reference is made to FIG. 16. An etch step is performed to remove the exposed portions of seed layer 212 that are not covered by the conductors 214, wherein the etch step may include an anisotropic etching. Some portions of the seed layer 212 that are covered by the conductors 214, on the other hand, remain not etched. Throughout the description, the conductors 214 and the remaining underlying portions of the seed layer 212 are in combination referred to as through integrated fan-out (InFO) vias (TIVs) 210, which are also referred to as through-vias. Although the seed layer 212 is shown as a layer separate from the conductors 214, when the seed layer 212 is made of a material similar to or substantially the same as the respective overlying conductors 214, the seed layer 212 may be merged with the conductors 214 with no distinguishable interface therebetween. In alternative embodiments, there exist distinguishable interfaces between the seed layer 212 and the overlying conductors 214.

After the formation of the TIVs 210, some conductors 194 not covered by the conductors 214 are exposed, so that subsequently placed semiconductor devices 220 (see FIG. 17) can be electrically connected to the redistribution structure 102 through the pre-exposed conductors 194. The method that forms the redistribution structure 102 before the semiconductor devices 220 are placed can be referred to as a "RDL-first" process herein.

Figure 17:
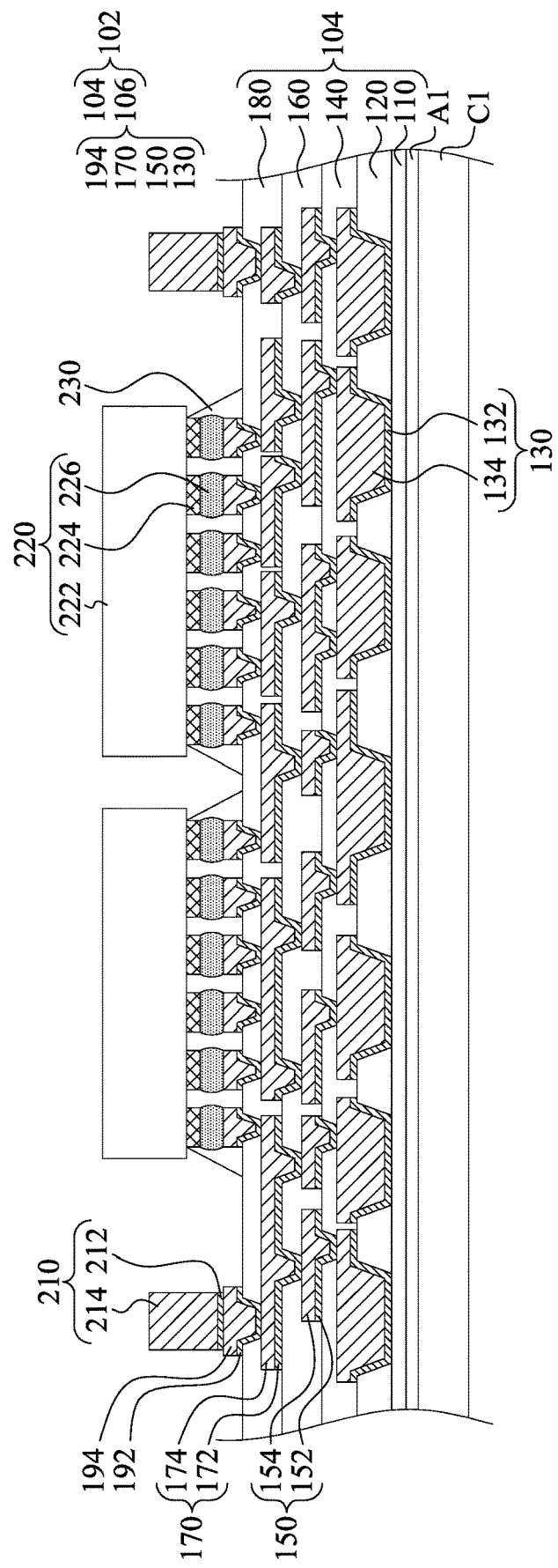

Reference is made to FIG. 17. The semiconductor devices 220 are disposed on or placed on the redistribution structure 102 using a pick-and-place machine, manually, or the like. The number of the semiconductor devices 220 is not limited in various embodiments of the present disclosure. The thicknesses of the semiconductor devices 220 may be the same or different, and various embodiments of the present disclosure are not limited in this regard. The semiconductor devices 220 can be electrically connected to some conductors 194 of the redistribution structure 102 not covered by the TIVs 210. For example, bonding pads 224 (such as copper pads) on the bottom portion of the semiconductor devices 220 are electrically connected to the conductors 194. In other words, the semiconductor devices 220 are disposed on the redistribution structure 102 using a "flip chip" approach; that is, the bonding pads 224 on the face of the semiconductor devices 220 are "flipped" over so they are "face down", and the bonding pads 224 are connected to the conductors 194 with a conductive material. For example, the bonding pads 224 can be electrically and mechanically connected to the exposed conductors 194 of the redistribution structure 102 through connectors 226. In some embodiments, the conductors 194 are formed as pads, and the connectors 226 may be solder bumps or solder balls, and these solder bumps or solder balls are in physical contact with the conductors 194 to form solder-on-pad (SOP) connections. In some other embodiments, the conductors 194 may be formed as traces, and the connectors 226 may include non-solder metal bumps. These non-solder metal bumps may include copper pillars and may include one or more layers including nickel, gold, palladium, or other suitable materials. These non-solder metal bumps (e.g., alternative forms of connector 226) and the conductors 194 may be bonded by solder to form bump-on-trace (BOT)

connections. By the SOP connections or BOT connections formed by the connectors 226, the semiconductor devices 220 may be in electrical connection with the redistribution structure 102.

As shown in FIG. 17, in the structure formed by the "RDL-first" process according to some embodiments, an underfill layer 230 can be optionally formed between the semiconductor device 220 and the redistribution structure 102 and among the connectors 226. The underfill layer 230 may be dispensed as a liquid using a capillary underfill ("CUP") approach. A resin or epoxy liquid is flowed beneath the semiconductor device 220 and fills the space between the semiconductor device 220 and the redistribution structure 102. Room temperature, UV, or thermal curing may be used to cure the underfill layer 230. The underfill layer 230 can provide mechanical strength and stress relief at least to the overlying semiconductor device 220 and the underlying redistribution structure 102. In some embodiments, the underfill layer 230 is the same as a subsequently formed molding compound 250 (see FIG. 22) that molds the semiconductor devices 220. That is, the space between the semiconductor devices 220 and the redistribution structure 102 may be filled by the subsequently formed molding compound 250.

In some embodiments, the semiconductor devices 220 are unpackaged semiconductor devices, such as logic device dies (e.g., accelerated processing unit (APU), graphics processing unit (GPU), piezoelectric multilayer actuator (PMA), piezoelectric actuator (PA), etc.), memory device dies (e.g., low power double-data-rate (LPDDR), Flash, high bandwidth memory (HBM), etc.), or sensor device dies (e.g., contact image sensor (CIS), micro-electro-mechanical system (MEMS), etc.). In some embodiments, the semiconductor devices 220 are designed for mobile applications and may be central computing unit (CPU) dies, power management integrated circuit (PMIC) dies, transceiver (TRX) dies, or the like. The semiconductor device 220 includes a semiconductor substrate 222 (a silicon substrate, for example), and the bonding pads 224 protrude from or level with a bottom dielectric layer (not shown) of the semiconductor device 220.

Figure 18:
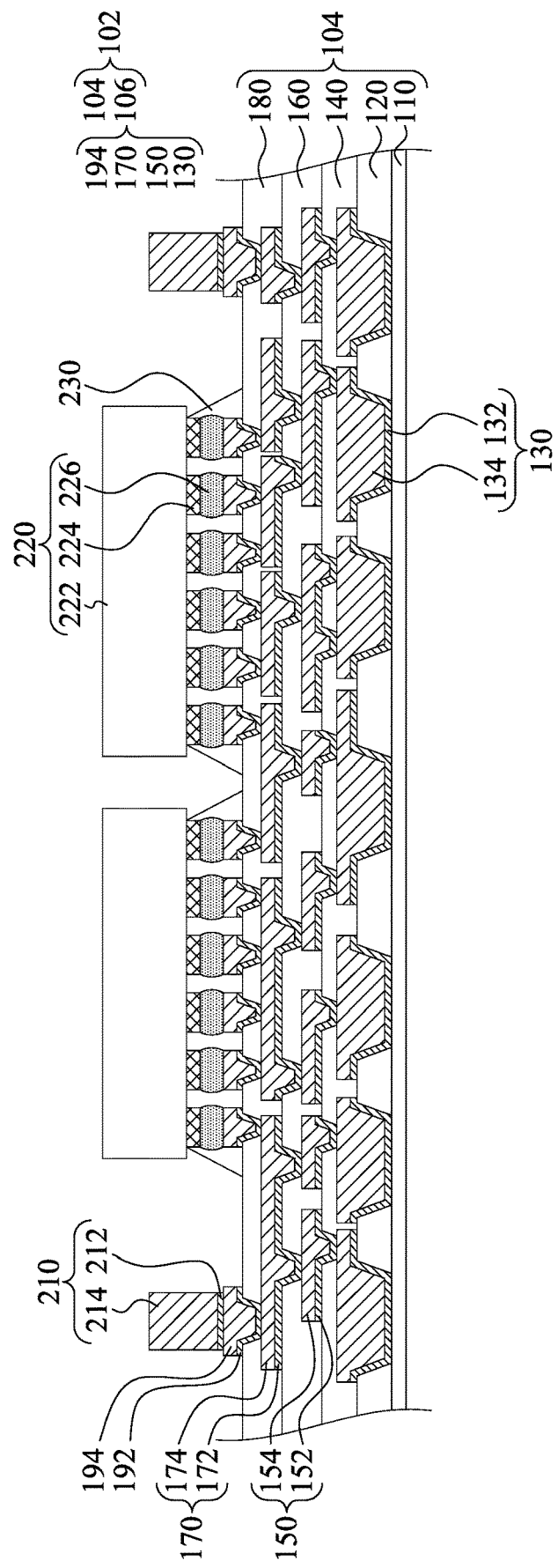

Reference is made to FIG. 18. The redistribution structure 102 is de-bonded from the carrier C1. The adhesive layer A1 is also cleaned from the buffer layer 110 of the redistribution structure 102. As a result of the removal of the adhesive layer A1, the buffer layer 110 of the redistribution structure 102 is exposed. In some embodiments, the structure as shown in FIG. 18 is adhered to a dicing tape (not shown). In some embodiments, a laminating film (not shown) can be placed onto the exposed buffer layer 110, wherein the laminating film may include SR, ABF, backside coating tape, or the like. In alternative embodiments, no laminating film is placed over the buffer layer 110.

Figure 19:
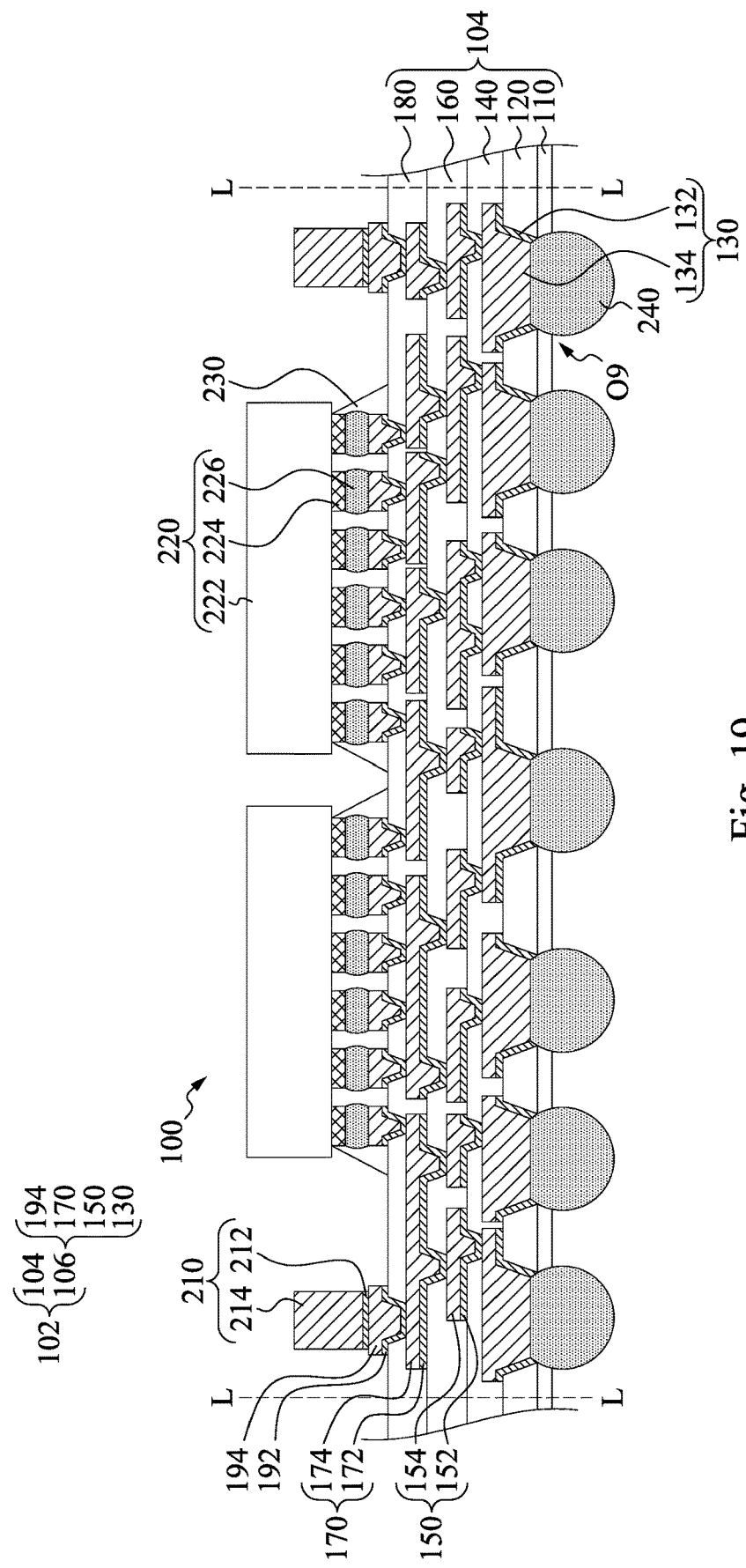

Reference is made to FIG. 19. The buffer layer 110 is patterned to form openings O9 and hence the RDLs 130 are exposed. In some embodiments, a laser drilling process is performed to form the openings O9 to remove portions of the buffer layer 110 and portions of the seed layer 132. That is, the openings O9 can be referred to as laser drilled openings. The laser drilling process may create a jagged profile or a rough profile of a sidewall of the opening O9. In some other embodiments, photolithography processes may also be used to form the openings O9 and remove portions of the buffer layer 110, and then an etch step is performed to remove the exposed portions of the seed layer 132, in which the etch step may include an anisotropic etching. As a result, portions of the conductors 134 are exposed through the openings O9. In some embodiments, the openings O9 are arranged in a grid pattern of rows and columns, so that conductive bumps (e.g., conductive balls 240) subsequently formed in the openings O9 can form the BGA.

The conductive balls 240 are formed on the exposed portions of the RDLs 130. In other words, the conductive balls 240 are electrically connected to the RDLs 130. As such, the conductive balls 240 can be electrically coupled to the RDLs 150 via the RDLs 130. The formation of the conductive balls 240 may include placing solder balls in the openings O9 of the buffer layer 110 and then reflowing the solder balls. Therefore, the conductive ball 240 is partially embeddedly retained in the opening O9 of the buffer layer 110. After the formation of the conductive balls 240, a singulation process is performed to saw the dielectric structure 104 along lines L-L, such that at least one semiconductor assembly 100 can be formed. In some embodiments where the assembly is adhered to a dicing tape, the dicing tape can be removed after the singulation process.

After the formation of the conductive balls 240, an electrical test can be performed to the redistribution structure 102, the semiconductor devices 220 and the TIVs 210, which may be beneficial to address some issues (e.g., defect/reliability) before molding the semiconductor devices 220 and the TIVs 210. In other words, the RDL-first process in accordance with some embodiments of the present disclosure allows the electrical test to be performed at an intermediate package through the conductive balls 240, as examples. In this way, the intermediate package, i.e. the semiconductor assembly 100, can be identified as a known good package when it passes the electrical test. In addition, the semiconductor assembly 100 is friendly to thermal-sensitive semiconductor devices 220 because the redistribution structure 102 is formed before disposing the semiconductor devices 220, in which high temperature processes are performed to form the redistribution structure 102, thereby preventing the semiconductor devices 220 from being damaged.

Figure 20:
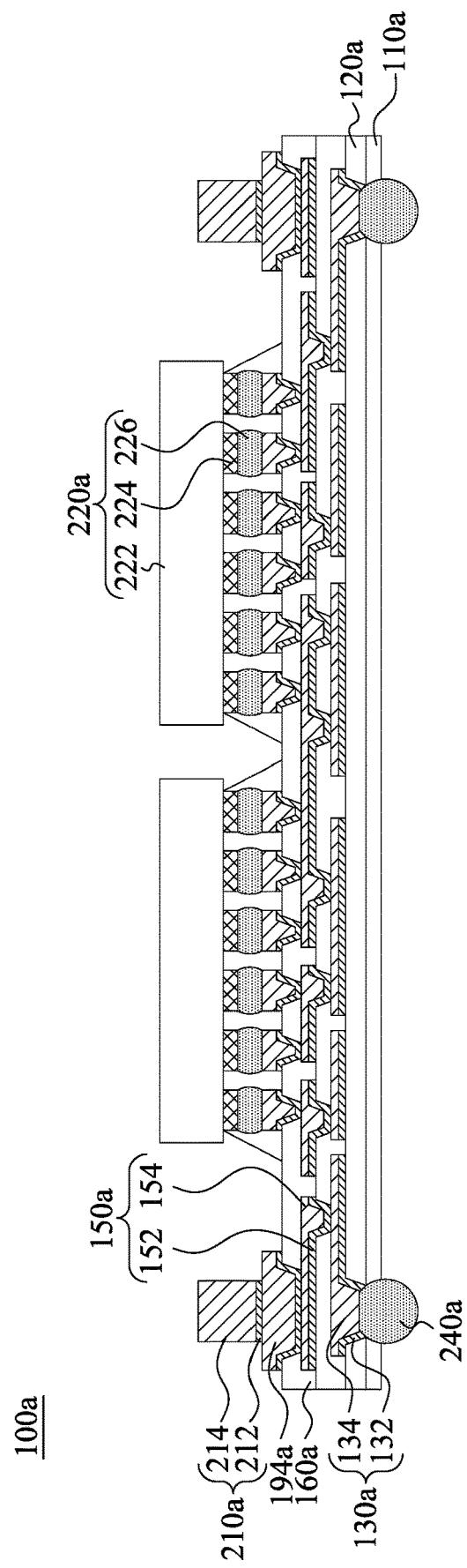
FIG. 20 is a cross-sectional view of a semiconductor assembly in accordance with some embodiments of the present disclosure.

FIG. 20 is a cross-sectional view of a semiconductor assembly 100a in accordance with some embodiments of the present disclosure. The semiconductor assembly 100a may be formed by manufacturing steps of the semiconductor assembly 100 as discussed previously. The semiconductor assembly 100a has RDLs 130a and less conductive balls 240a than the conductive balls 240 of the semiconductor assembly 100. The RDLs 130a is located in the dielectric layer 120a and electrically connected to the semiconductor device 220a and the TIVs 210a, and the conductive balls 240a are electrically connected to the RDLs 130a. In some embodiments, the semiconductor assembly 100a includes semiconductor devices 220a, which are the same as the semiconductor devices 220 of FIG. 19. In alternative embodiments, the semiconductor devices 220a of FIG. 20 are different from the semiconductor devices 220 of FIG. 19, and various embodiments of the present disclosure are not limited in this regard.

After the formations of the semiconductor assembly 100 of FIG. 19 and at least one semiconductor assembly 100a of FIG. 20, the semiconductor assembly 100a is bonded to the semiconductor assembly 100 through the conductive balls 240a of the semiconductor assembly 100a and the TIVs 210 of the semiconductor assembly 100. The conductive balls 240a are respectively substantially aligned with the TIVs 210. As a result, the semiconductor assembly 100a can be stacked on the semiconductor assembly 100.

In some embodiments, TIVs 210a of the semiconductor assembly 100a are respectively substantially aligned with the conductive balls 240a. As a result of such configuration, at least two semiconductor assemblies 100a can be stacked through the conductive balls 240a of the upper semiconductor assembly 100a and the TIVs 210a of the lower semiconductor assembly 100a.

Figure 21:
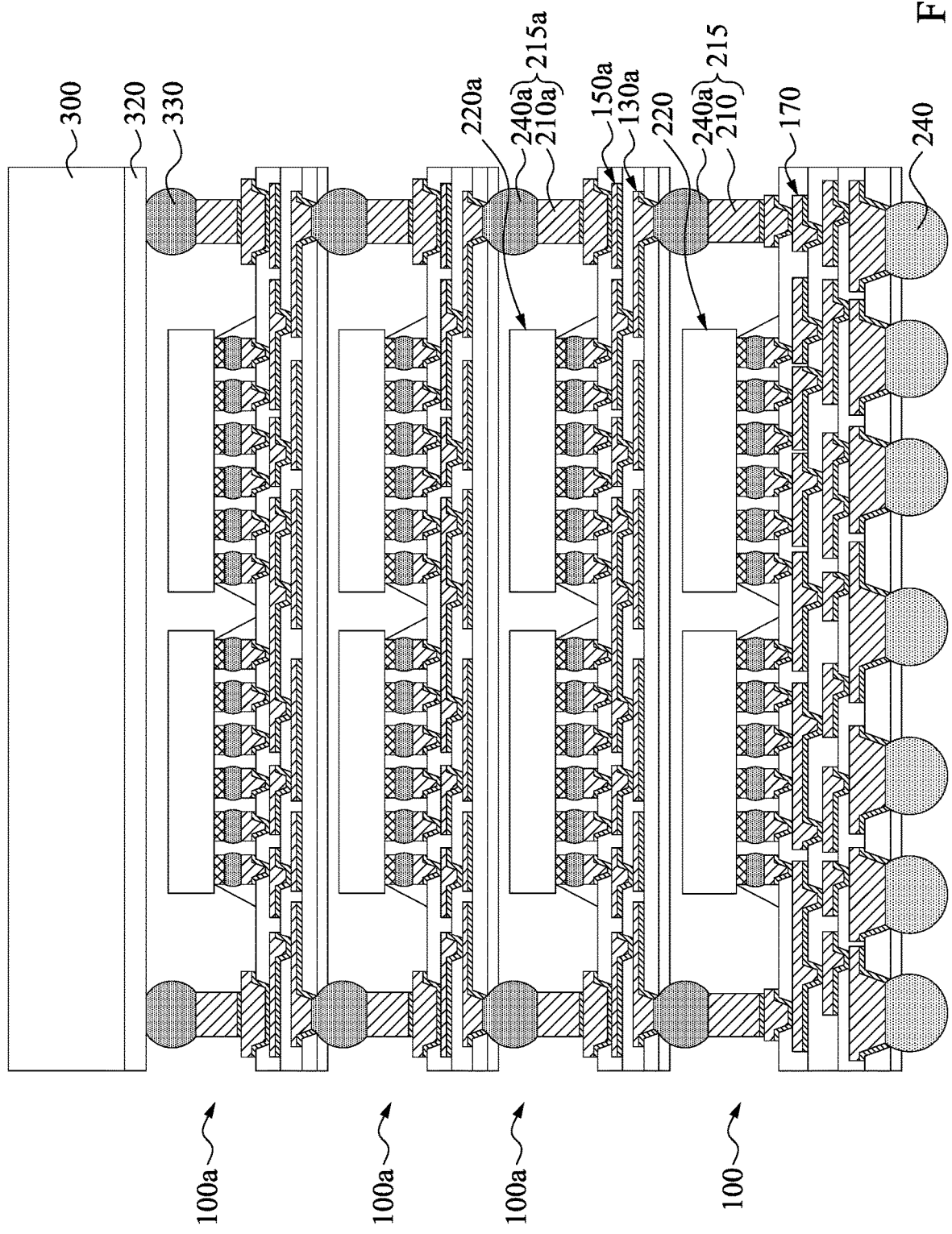
FIGS. 21-22 are cross-sectional views of intermediate stages in the manufacturing of the package structure after the step of FIG. 17.
Figure 22:
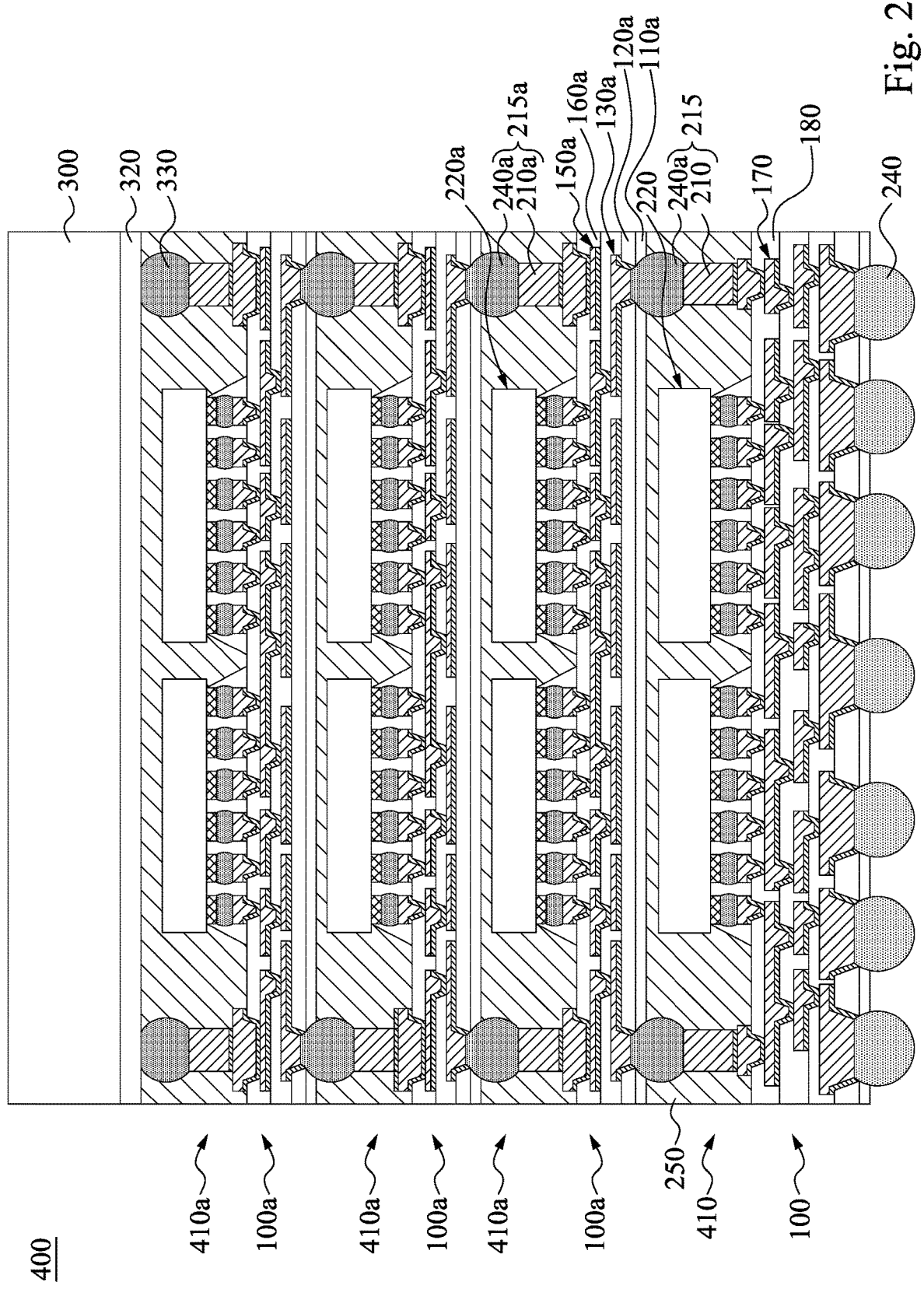

FIGS. 21-22 are cross-sectional views of intermediate stages in the manufacturing the package structure after the step of FIG. 19. Reference is made to FIG. 21. After the semiconductor assembly 100 and plural semiconductor assemblies 100a are formed, one of the semiconductor assemblies 100a is stacked on the semiconductor assembly 100 through the conductive balls 240a at the bottom side of the semiconductor assembly 100a and the TIVs 210 at the top side of the semiconductor assembly 100. As a result, the RDLs 130a of the semiconductor assembly 100a are bonded to the RDLs 170 of the semiconductor assembly 100. In other words, conductive features 215 including the TIVs 210 and the overlying conductive balls 240a electrically connect the RDLs 130a of the semiconductor assembly 100a and the RDLs 170 of the semiconductor assembly 100. In addition, conductive features 215a including the TIVs 210a and the overlying conductive balls 240a electrically connect the RDLs 130a through the RDLs 150a. Thereafter, other semiconductor assemblies 100a are sequentially stacked on the first stacked semiconductor assembly 100a through the conductive balls 240a and the TIVs 210a. In some embodiments, the semiconductor assemblies 100a are the same. In alternatively embodiments, the semiconductor assemblies 100a are different. For example, the semiconductor assemblies 100a may have different kinds of semiconductor devices 220a, different layers of RDLs 150a, and/or different layout of RDLs 150a.

After the semiconductor assemblies 100a are bonded to the semiconductor assembly 100, a semiconductor package 300 is bonded to the upper semiconductor assembly 100a. The semiconductor package 300 is over the stacked assemblies of the semiconductor assemblies 100a and 100. In some embodiments, the semiconductor package 300 includes a substrate 320 and conductive bumps or conductive balls 330. The conductive bumps 330 protrude from the substrate 320. In addition, the conductive bumps 330 of the semiconductor package 300 are substantially aligned with the TIVs 210a of the upper semiconductor assembly 100a, respectively. In such configuration, the semiconductor package 300 can be bonded to the upper semiconductor assembly 100a through the conductive bumps 330 at the bottom side of the semiconductor package 300 and the TIVs 210a at the top side of the upper semiconductor assembly 100a, and hence the semiconductor package 300 is electrically connected to the underlying TIVs 210a through the conductive bumps 330. However, various embodiments of the present disclosure are not limited to the sequence of the aforementioned steps. For example, the semiconductor assemblies 100a are jointed to form a stacked structure, and then the semiconductor package 300 is bonded to the top side of the stacked structure. Thereafter, the lower side of the stacked structure is bonded to the semiconductor assembly 100, such that the structure of FIG. 21 may be also obtained. In some embodiments, the semiconductor package 300 may be memory devices, such as a static random access memory (SRAM) or dynamic random access memory (DRAM) device. The semiconductor package 300 may include a plurality of stacked memory dies therein. Moreover, other types of the semiconductor package 300 may be present on the semiconductor assembly 100a as well, and various embodiments of the present disclosure are not limited in this regard.

Reference is made to FIG. 22. After the formation of the stacked structure as shown in FIG. 21, a molding material (or molding compound) 250 molds the semiconductor devices 220, 220a, the TIVs 210, 210a, and the conductive balls 240a, 330. The semiconductor package 300 is over the molding material 250. In other words, the molding material 250 is formed between the semiconductor assembly 100 and the overlying semiconductor assembly 100a, between two adjacent semiconductor assemblies 100a, and between the semiconductor package 300 and the underlying semiconductor assembly 100a. Furthermore, the molding material 250 surrounds the semiconductor devices 220, 220a, the TIVs 210, 210a, and the conductive balls 240a, 330. The molding material 250 fills gaps between the semiconductor devices 220 and the TIVs 210 and fills gaps between the semiconductor devices 220a and the TIVs 210a. In addition, the molding material 250 has a portion between the semiconductor device 220 and the dielectric layer 120a (or the buffer layer 110a). The TIVs 210, the conductive balls 240a, and the TIVs 210a are in contact with the molding material 250. The molding material 250 may be in contact with the dielectric layer 180, the dielectric layer 160a, the buffer layer 110a, and the substrate 320. After the formation of the molding material 250, the semiconductor assembly 100 and the overlying molding material 250 forms a TIV package 410, and the semiconductor assemblies 100a and the overlying molding materials 250 form TIV packages 410a. Therefore, a combination of the TIV package 410, the TIV packages 410a, and the semiconductor package 300 forms a package structure 400, and the resulting structure is shown in FIG. 22.

In some embodiments, the molding material 250 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Because one molding step can enable the molding material 250 to fill gaps between the semiconductor assembly 100 and the overlying semiconductor assembly 100a, between two adjacent semiconductor assemblies 100a, and between the semiconductor package 300 and the underlying semiconductor assembly 100a, cycle time and warpage in fabricating the package structure 400 can be reduced.

In addition, when the package structure 400 is disposed on a printed circuit board (PCB), the package structure 400 occupies an area of the PCB the same as that of the semiconductor assembly 100, the semiconductor assemblies 100a, or the semiconductor package 300, and hence the area of the PCB occupied by the semiconductor assemblies 100, 100a and the semiconductor package 300 can be reduced.

Since the package structure 400 is a three-dimensional package on package (POP) structure, performance of a system on which the package structure 400 is disposed may be improved due to short-length and high-bandwidth communications among the TIV packages 410, 410a, and the semiconductor package 300. Moreover, the package structure 400 may include various semiconductor devices (e.g., 220 and 220a) and the semiconductor package 310, so as to be flexibly used by designers.

In some embodiments, the TIV package 410 has more semiconductor devices 220 therein, and at least one of the TIV packages 410a has more semiconductor devices 220a therein. As a result of such configuration, the number of layers of the TIV packages 410a can be decreased but the package structure 400 may still have the same function. Moreover, the total height of the package structure 400 can be reduced.

Figure 23:
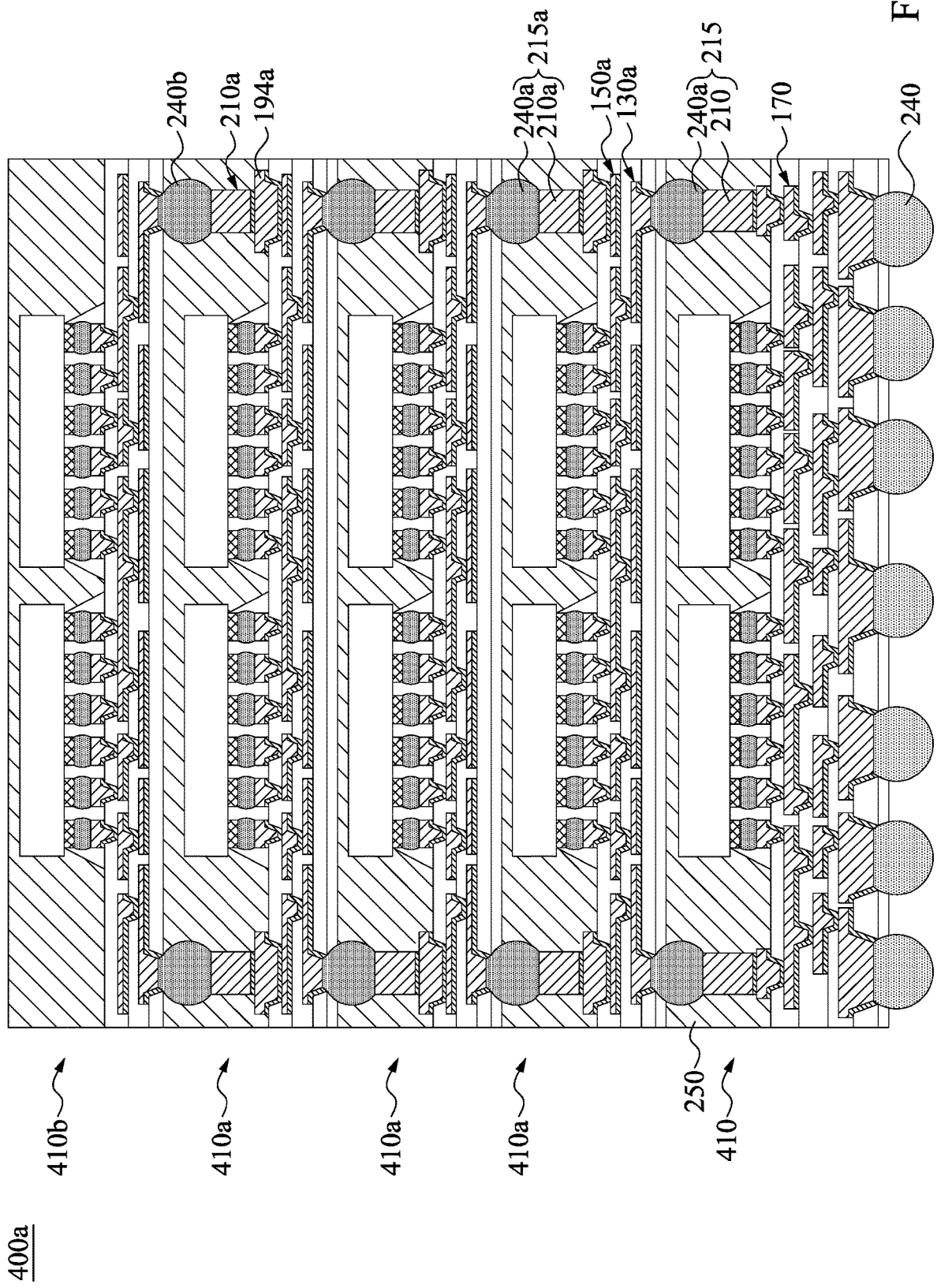
FIG. 23 is a cross-sectional view of a package structure in accordance with some embodiments of the present disclosure.

FIG. 23 is a cross-sectional view of a package structure 400a in accordance with some embodiments of the present disclosure. The package structure 400a includes the TIV package 410, the TIV packages 410a, and an overlying TIV package 410b. The difference between the TIV package 410b and one of the TIV packages 410a is that there is no TIV 210a and underlying conductors 194a in the TIV package 410b. Conductive balls 240b of the TIV package 410b are substantially aligned with the underlying TIVs 210a of the TIV package 410a, and hence the conductive balls 240b of the TIV package 410b can be respectively bonded to the underlying TIVs 210a of the TIV package 410a.

Figure 24:
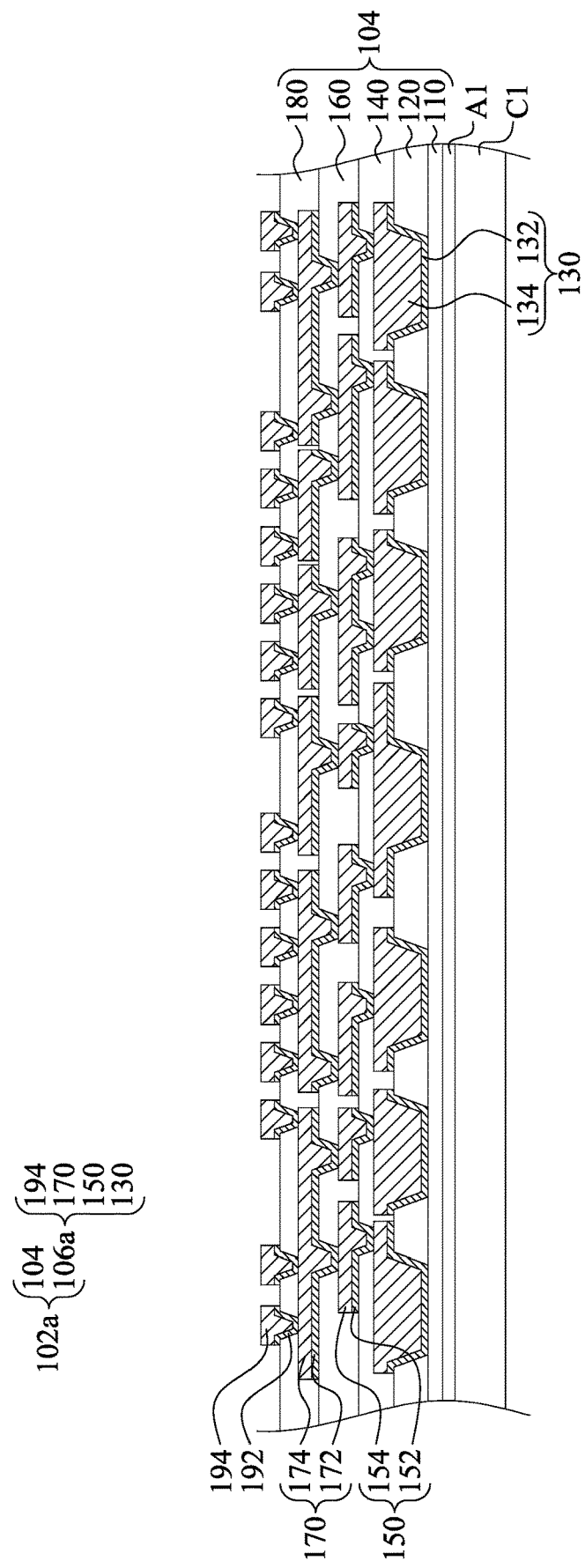
FIGS. 24-32 are cross-sectional views of intermediate stages in the manufacturing of a package structure in accordance with some embodiments of the present disclosure.

FIGS. 24-32 are cross-sectional views of intermediate stages in the manufacturing of a package structure in accordance with some embodiments of the present disclosure. Reference is made to FIG. 24. A redistribution structure 102a including the dielectric structure 104 and a wiring structure 106a is formed on the carrier C1. The formation of the redistribution structure 102a is similar to that of the redistribution structure 102 described above from FIGS. 1 to 13, and will not be repeated in the following description. The pattern of the wiring structure 106a of FIG. 24 is different from that of the wiring structure 106 of FIG. 13, but various embodiments of the present disclosure are not limited in this regard.

Figure 25:
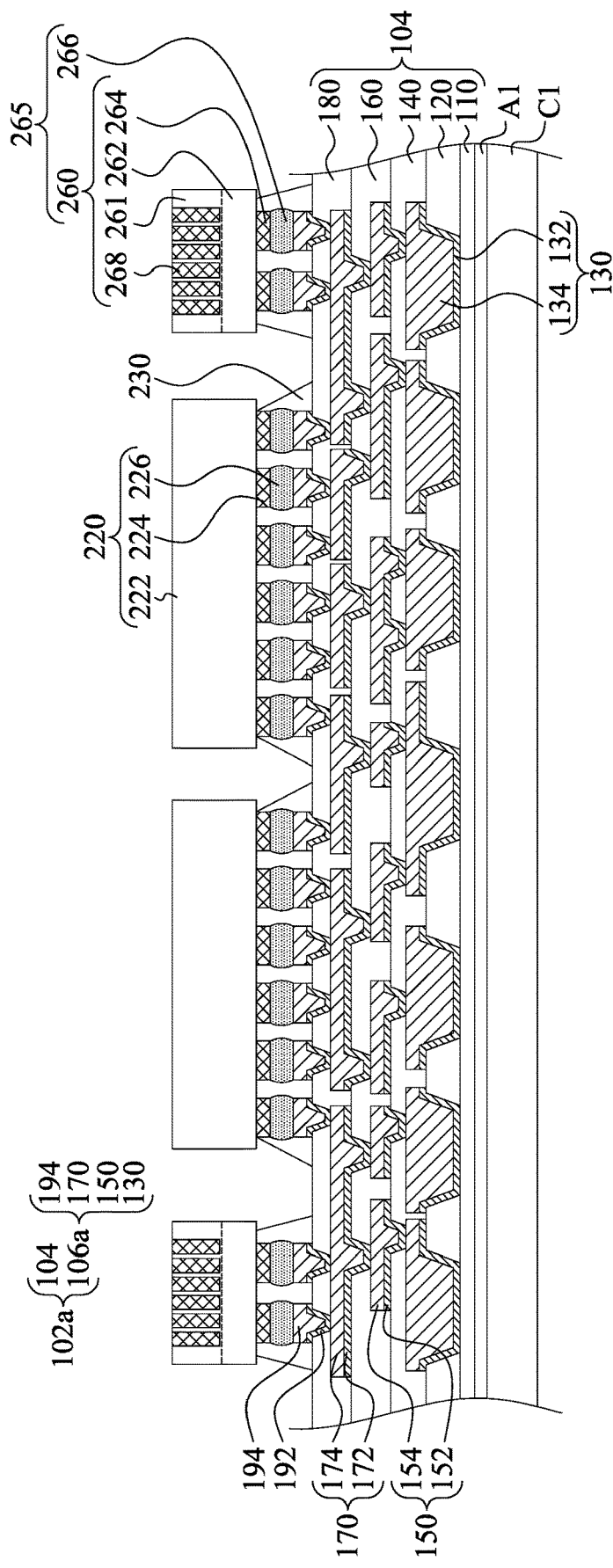

Reference is made to FIG. 25. Conductive features 265 include passive interposers 260 and conductive bumps 266. In some embodiments, the passive interposers 260 are through silicon via (TSV) devices. The semiconductor devices 220 and TSV devices 260 are disposed on or placed on the redistribution structure 102a using a pick-and-place machine, manually or other suitable methods. The TSV devices 260 are over the dielectric layer 180, and TSVs 268 are in the TSV devices 260 and electrically connected to contact pads 264. The conductive bumps 266 are between and electrically connect the TSV device 260 and the RDLs 170. The number of the semiconductor devices 220 and the number of the TSV devices 260 are not limited in various embodiments of the present disclosure. The semiconductor devices 220 and the TSV devices 260 can be electrically connected to the conductors 194 of the redistribution structure 102a. The bonding pads 224 of the semiconductor devices 220 and the contact pads 264 of the TSV devices 260 are connected to the conductors 194 with conductive material. For example, the bonding pads 224 can be electrically and mechanically connected to some of the conductors 194 through the connectors 226, e.g. conductive bumps, and the contact pads 264 can be electrically and mechanically connected to the other conductors 194 through the conductive bumps 266.

As shown in the assembly of FIG. 25, in the structure formed by the "RDL-first" process according to some embodiments, the underfill layer 230 can be optionally formed between the semiconductor device 220 and the redistribution structure 102a and among the connectors 226, and can be optionally formed between the TSV devices 260 and the redistribution structure 102a and among the conductive balls 266.

In some embodiments, the TSV devices 260 may include, for example, through silicon vias (TSVs) 268 and integrated passive devices (IPDs, not shown). The TSV devices 260 allow a higher density of structures, such as TSVs 268 and/or IPDs, to be formed therein. In some embodiments, the TSV device 260 comprises a substrate 261 comprise a semiconductor material, such as silicon or the like. Holes in the substrate 261 can be filled with conductors to form TSVs 268 and IPDs, such as trench capacitors. The TSV device 260 comprises an interconnect layer 262 which includes one or more layers of dielectric material with conductive features formed therein. In some embodiment, the layers of dielectric material in the interconnect layer 262 are formed of a photo-sensitive material such as polybenzoxazole (PBO), polyimide (PI), benzocyclobutene (BCB), or the like. In alternative embodiments, the layers of dielectric material in the interconnect layer 262 may be formed of a nitride such as silicon nitride, an oxide such as silicon oxide, phosphosilicate glass (PSG), borosilicate glass (BSG), boron-doped phosphosilicate glass (BPSG), or the like. In some alternative embodiments, the interconnect layer 262 may comprise an interposer or packaging substrate, such as a silicon interposer, organic substrate, a laminate substrate (e.g., a 1-2-1 laminate substrate), or the like. The interconnect layer 262 provides electrical connections between opposing sides and may act as an RDL structure. A set of external contact pads 264 provide an external electrical connection using, for example, conductive bumps 266.

As illustrated, a pitch between neighboring TSVs 268 is shorter than a pitch of neighboring TIVs (e.g. TIV 210 or 210a as described previously), and therefore, if the TSVs 268 are to be bonded with bumps, the TSVs 268 with shorter pitch allow higher density of the bumps.

Figure 26:
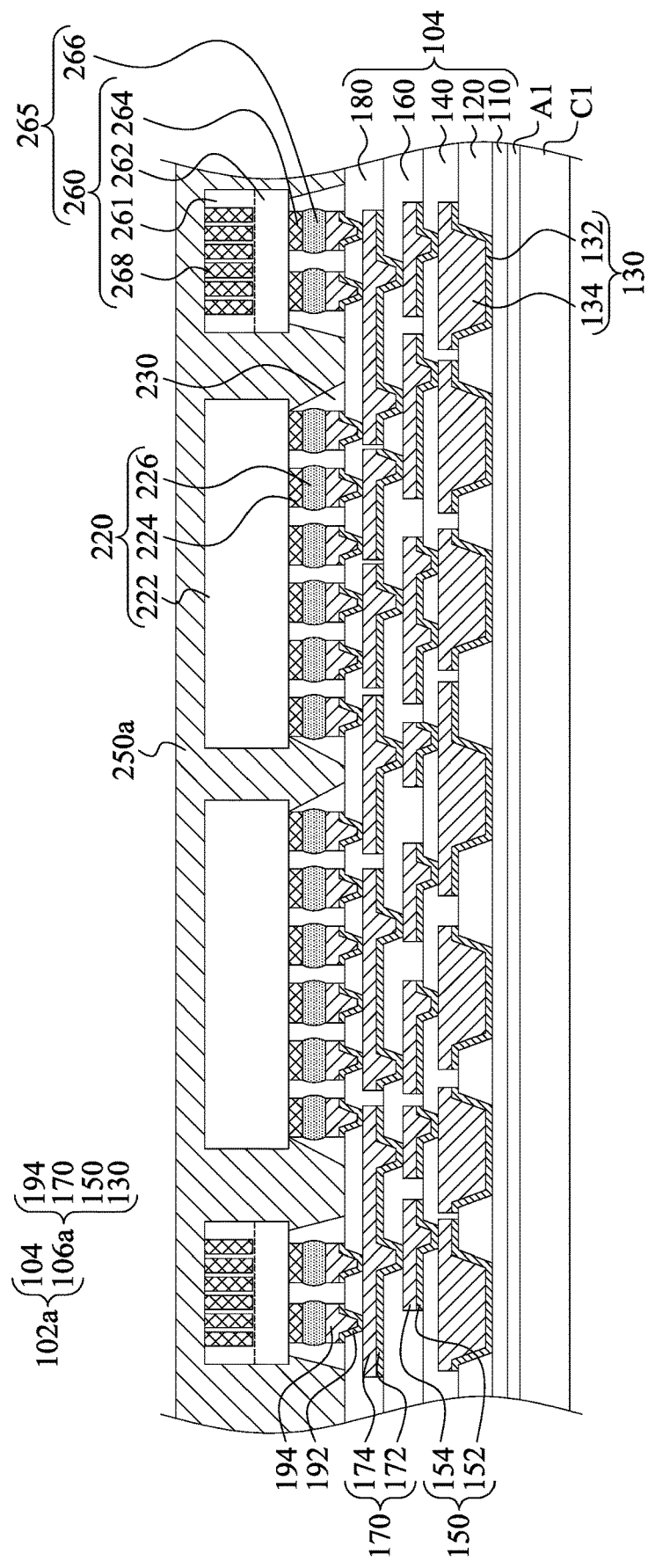

Reference is made to FIG. 26. A molding material (or molding compound) 250a is molded on the redistribution structure 102a, the semiconductor devices 220, and the TSV devices 260. The molding material 250a fills gaps between the semiconductor devices 220 and the TSV devices 260 and may be in contact with the redistribution structure 102a, such as the dielectric layer 180 of the redistribution structure 102a. The top surface of the molding material 250a is higher than the top surfaces of the semiconductor devices 220 and the TSV devices 260.

In some embodiments, the molding material 250a includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Figure 27:
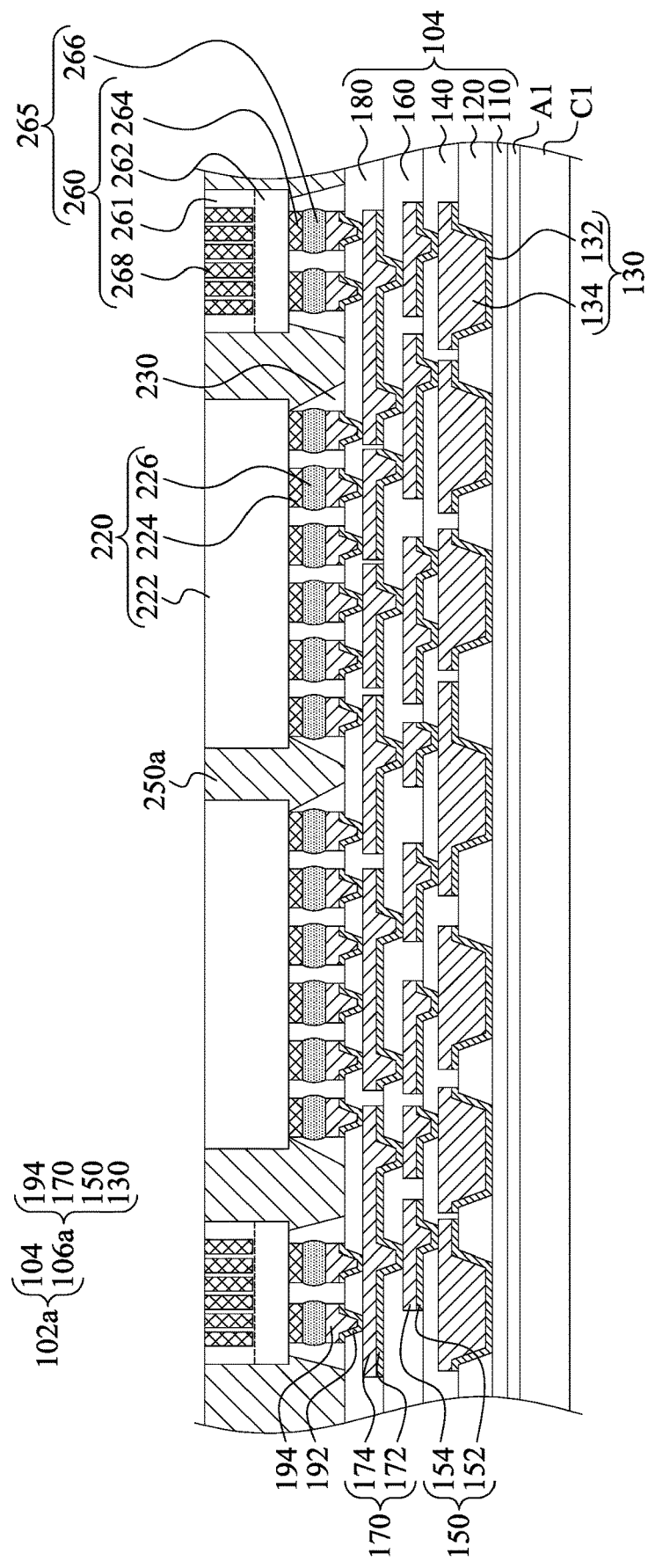

Reference is made to FIG. 27. Next, a planarization process, such as grinding, is performed to thin the molding material 250a, until the top surfaces of the semiconductor devices 220 and the TSV devices 260 are exposed. The molding material 250a surrounds the semiconductor devices 220 and the TSV devices 260. In some embodiments, the TSVs 268 on the top surfaces of the TSV devices 260 are also exposed after the grinding the molding material 250a. The resulting structure is shown in FIG. 27, in which the molding material 250a is in contact with sidewalls of the semiconductor devices 220 and the TSV devices 260. Due to the grinding, the top surfaces of the semiconductor devices 220 are substantially level (coplanar) with top surfaces of the TSV devices 260, and are substantially level (coplanar) with the top surface of the molding material 250a. As a result of the grinding, conductive residues such as metal particles may be generated, and left on the top surface of the structure shown in FIG. 27. Accordingly, after the grinding, a cleaning may be performed, for example, through a wet etching, so that the conductive residues are removed.

Figure 28:
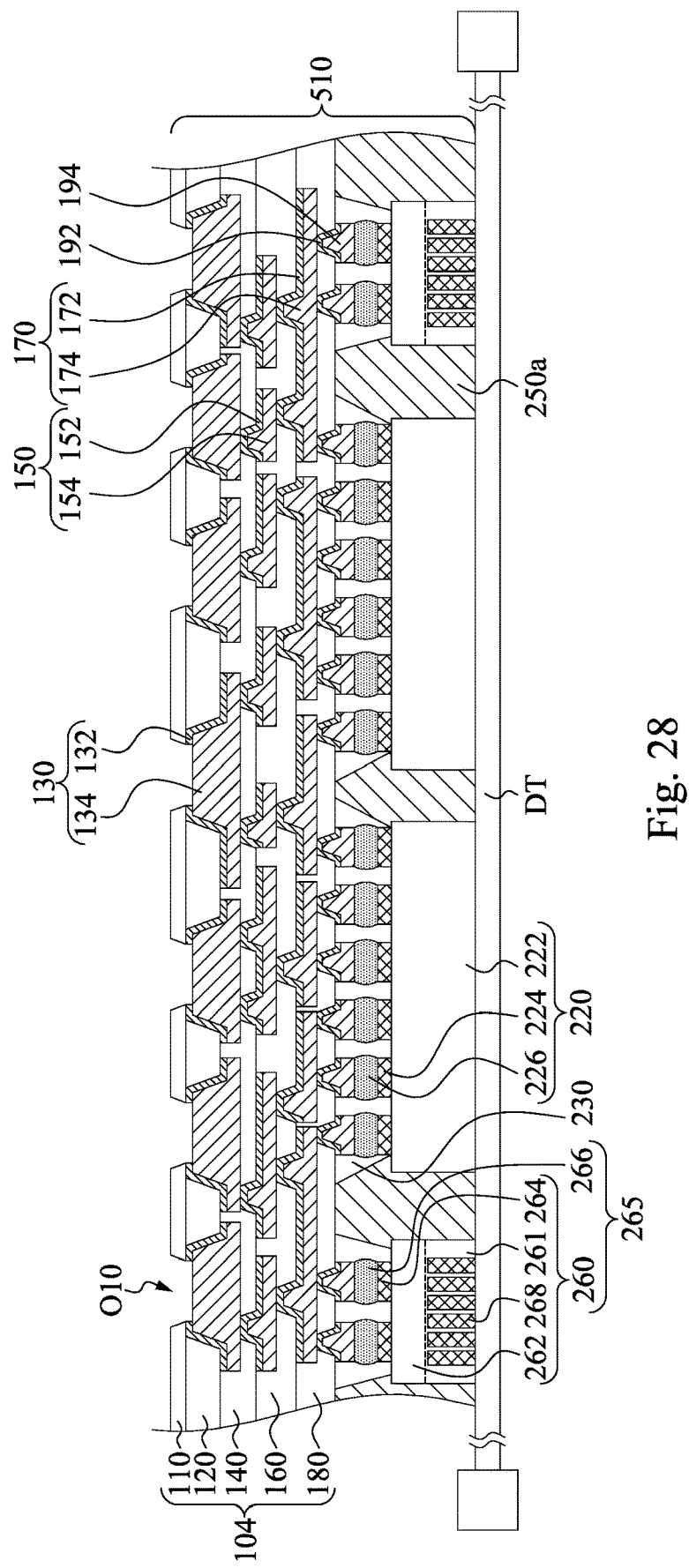

Reference is made to FIG. 28. Next, a molded package 510 is de-bonded from the carrier C1. The adhesive layer A1 is also cleaned from the molded package 510. As a result of the removal of the adhesive layer A1, the buffer layer 110 is exposed. Referring to FIG. 28, the molded package 510 with the semiconductor devices 220, the molding material 250a, and the TSV devices 260 thereon is further adhered to a dicing tape DT, wherein the molding material 250a faces toward, and may contact, the dicing tape DT. In some embodiments, a laminating film (not shown) is placed onto the exposed buffer layer 110, wherein the laminating film may include an ajinomoto buildup film (ABF), a solder resist film (SR), backside coating tape, or the like. In alternative embodiments, no laminating film is placed over the buffer layer 110.

Openings O10 are formed in the buffer layer 110. After the formation of the openings O10 of the buffer layer 110, portions of the seed layer 132 of the RDLs 130 are exposed through the openings O10. In some embodiments, a laser drilling process is performed to form the openings O10. In some other embodiments, photolithography processes may also be used to form the openings O10. Thereafter, an etch step is performed to remove the exposed portions of the seed layer 132, in which the etch step may include an anisotropic etching. As a result, portions of the conductors 134 underlying the seed layer 132 are exposed through the openings O10, so as to receive subsequently formed the conductive balls 240 (see FIG. 29). In some embodiments, the openings O10 are arranged in a grid pattern of rows and columns, so that the conductive balls 240 subsequently formed in the openings O10 can form a ball grid array (BGA).

Figure 29:
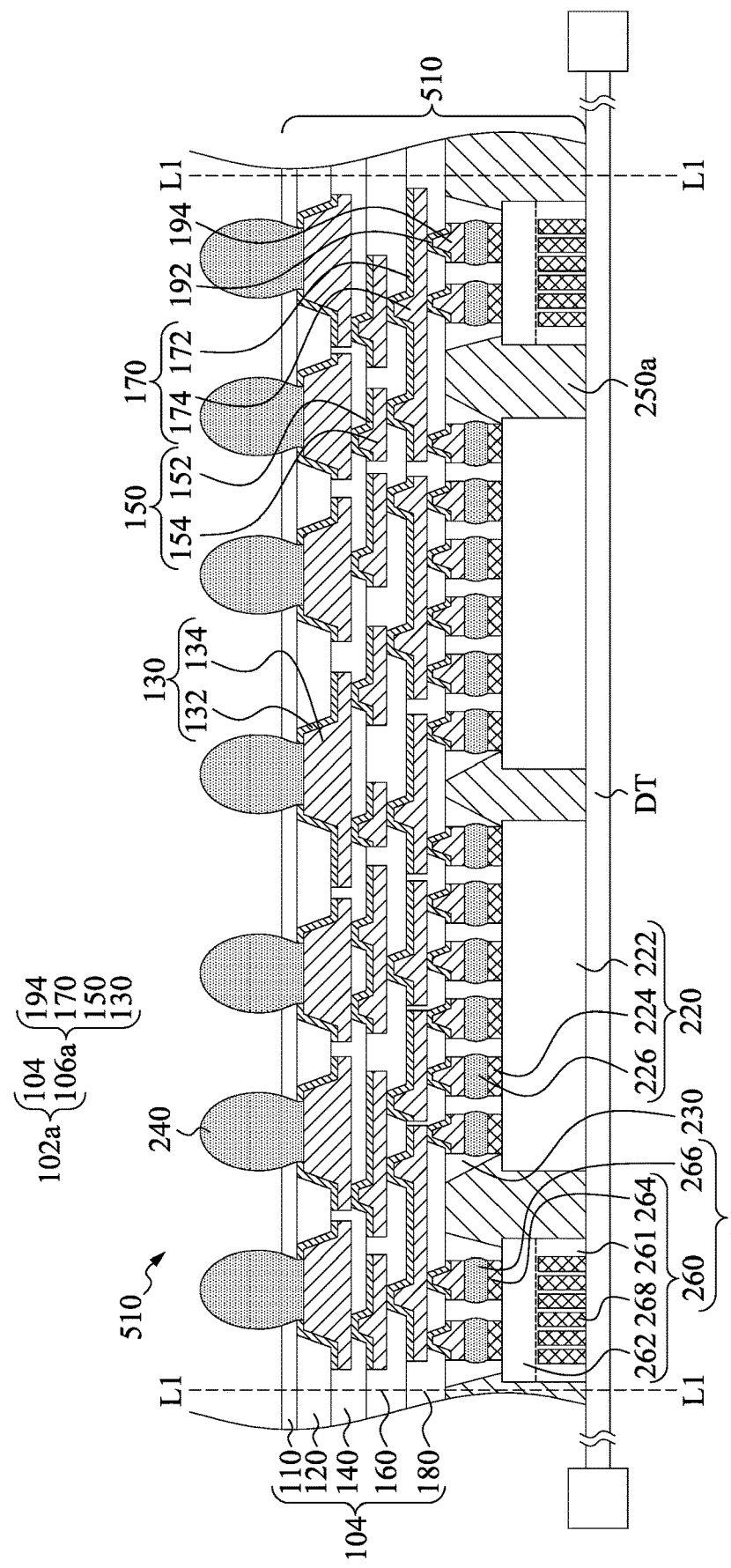

Reference is made to FIG. 29. Conductive bumps, such as the conductive balls 240, are formed on the exposed portions of the conductors 134. In other words, the conductive balls 240 are respectively in contact with the conductors 134, so that the conductive balls 240 can be electrically connected to the conductors 134. As such, the conductive balls 240 can be electrically coupled to the wiring structure 106a via the conductors 134. The formation of the conductive balls 240 may include placing solder balls in the openings O10, and then reflowing the solder balls.

After the conductive balls 240 are formed, a singulation process is carried out to saw the dielectric structure 104 and the molding material 250a along lines L1, and the dicing tape DT can be removed as well, such that plural chip-scale molded packages 510 may be formed.

Figure 30:
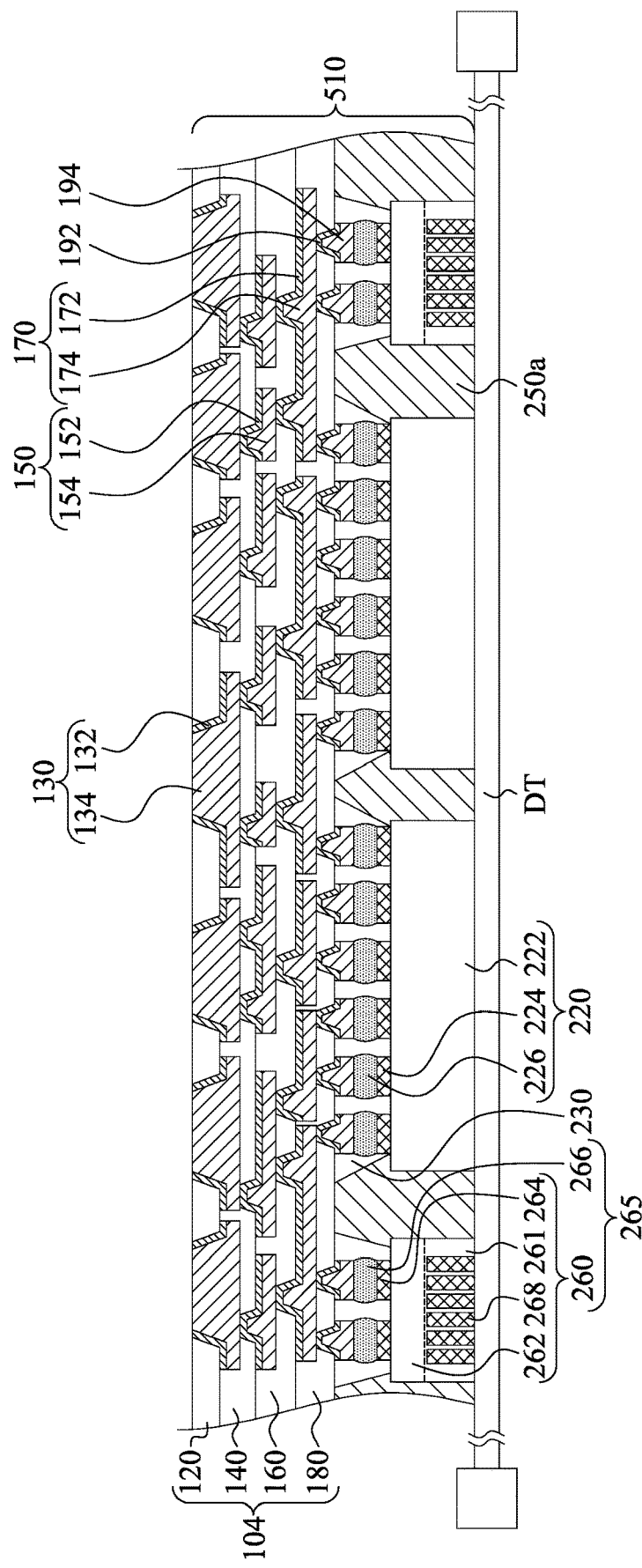
Figure 31:
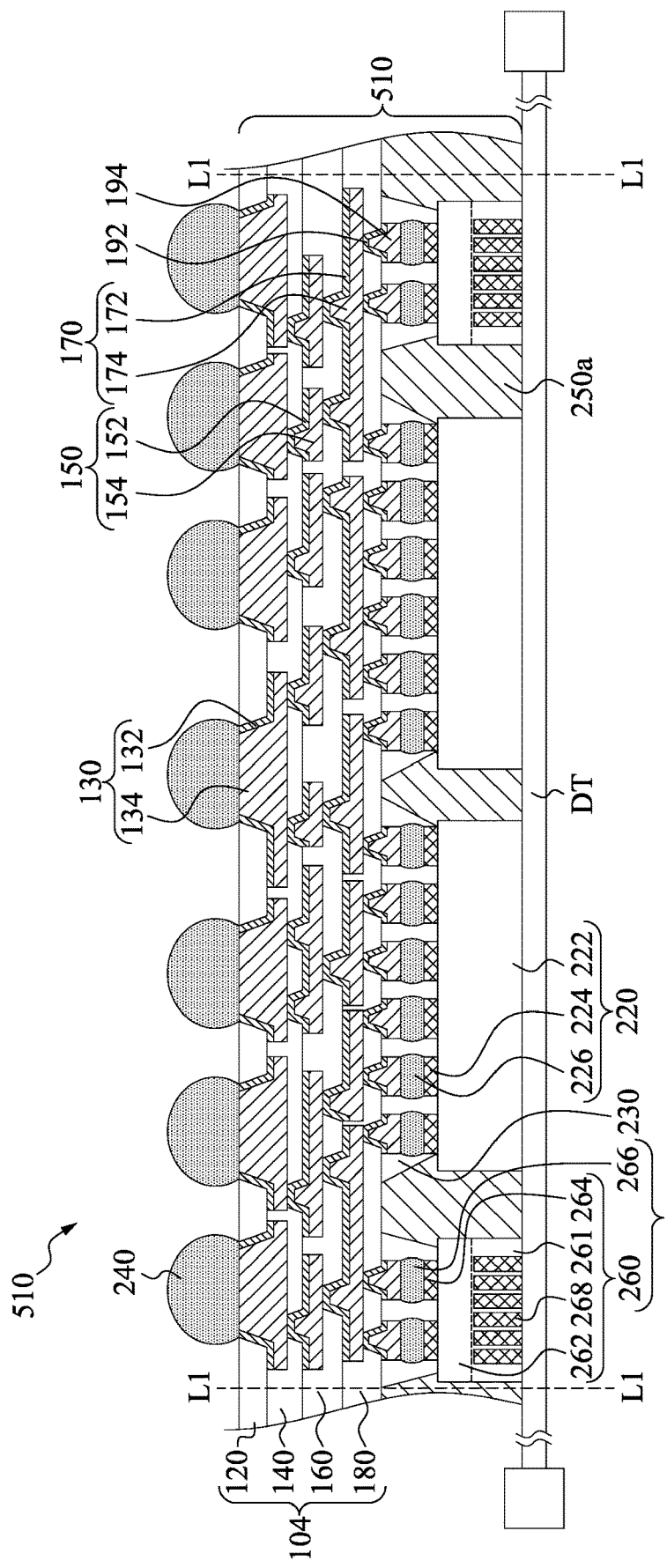

In alternative embodiments, after the carrier C1 is de-bonded and the adhesive layer A1 is cleaned, one or more etch operations are carried out to remove the buffer layer 110 and horizontal portions of the seed layers 132 until the conductors 134 are exposed. The resulting structure is shown in FIG. 30, in which top surfaces of the RDLs 130 are exposed and substantially level with a top surface of the remaining dielectric layer 120. After the etching process, the conductive balls 240 are formed on the exposed RDLs 130, and resulting structure is shown in FIG. 31.

Figure 32:
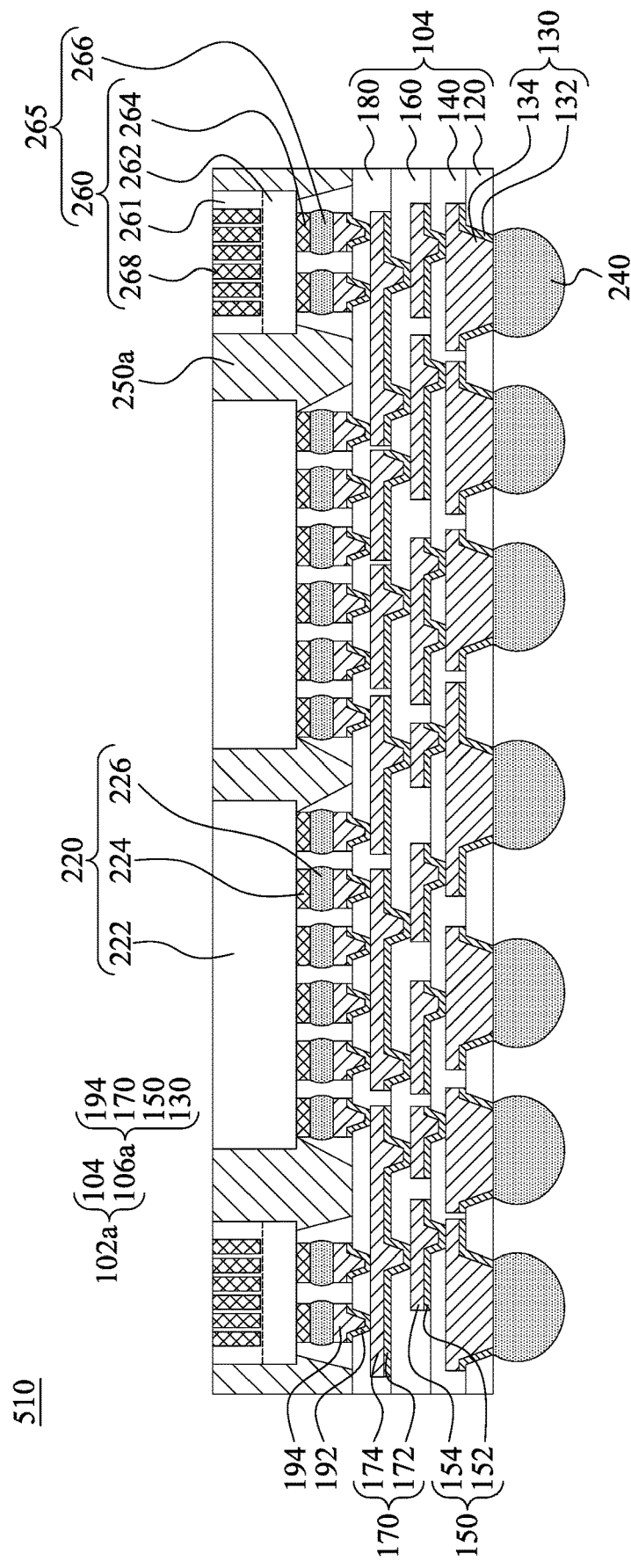

After the conductive balls 240 are formed, a singulation process is carried out to saw the dielectric structure 104 and the molding material 250a along lines L1, and the dicing tape DT can be removed as well, such that plural chip-scale molded packages 510 may be formed, and the resulting structure is shown in FIG. 32. In the following description, the RDLs 130, the conductive balls 240, and the dielectric layer 120 shown in FIG. 31 are formed in packages as shown in FIGS. 32-35. In some alternative embodiments, the RDLs 130, the conductive balls 240, the buffer layer 110, and the dielectric layer 120 shown in FIG. 29 can be formed in packages as shown in FIGS. 32-35, and the various embodiments of the present disclosure are not limited in this regard.

Figure 33:
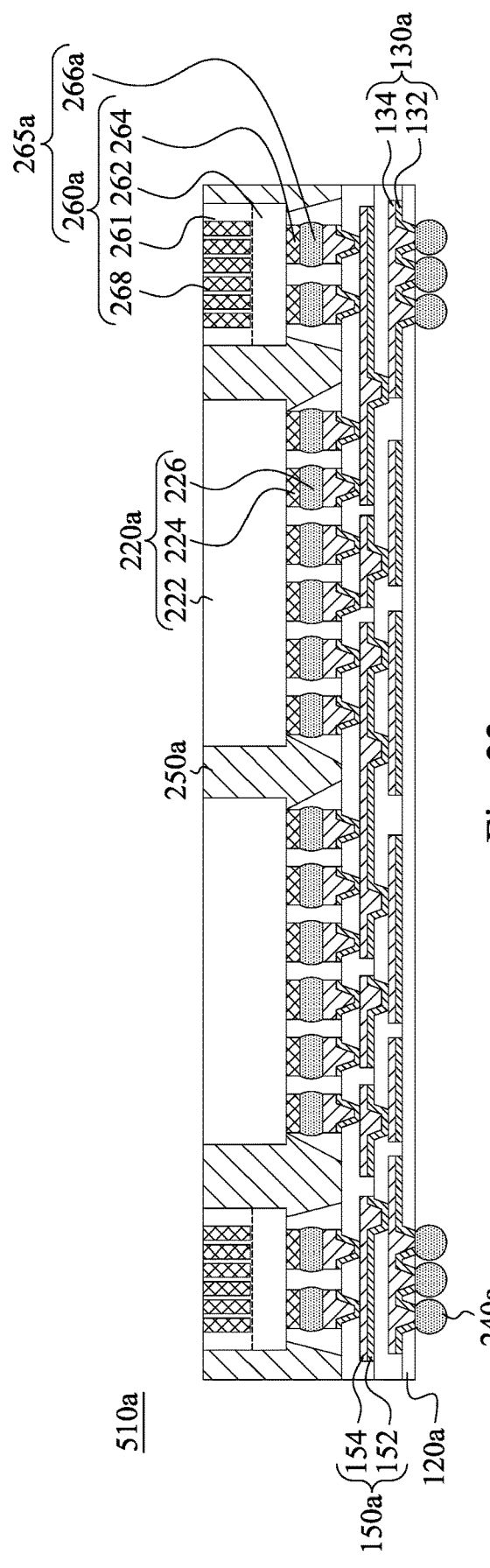
FIG. 33 is a cross-sectional view of a molded package in accordance with some embodiments of the present disclosure.

FIG. 33 is a cross-sectional view of a molded package 510a in accordance with some embodiments of the present disclosure. The molded package 510a may be formed by aforementioned manufacturing steps of the molded package 510. Compared with the molded package 510, the molded package 510a has the RDLs 130a therein, and has the conductive balls 240a that are substantially aligned with the overlying TSV devices 260 of the molded package 510, respectively. In some embodiments, the molded package 510a includes the semiconductor devices 220a and TSV devices 260a respectively the same as the semiconductor devices 220 and the TSV devices 260 of FIG. 32. In alternative embodiments, the semiconductor devices 220a and the TSV devices 260a are respectively different from the semiconductor devices 220 and the TSV devices 260 of FIG. 32, and various embodiments of the present disclosure are not limited in this regard.

Figure 34:
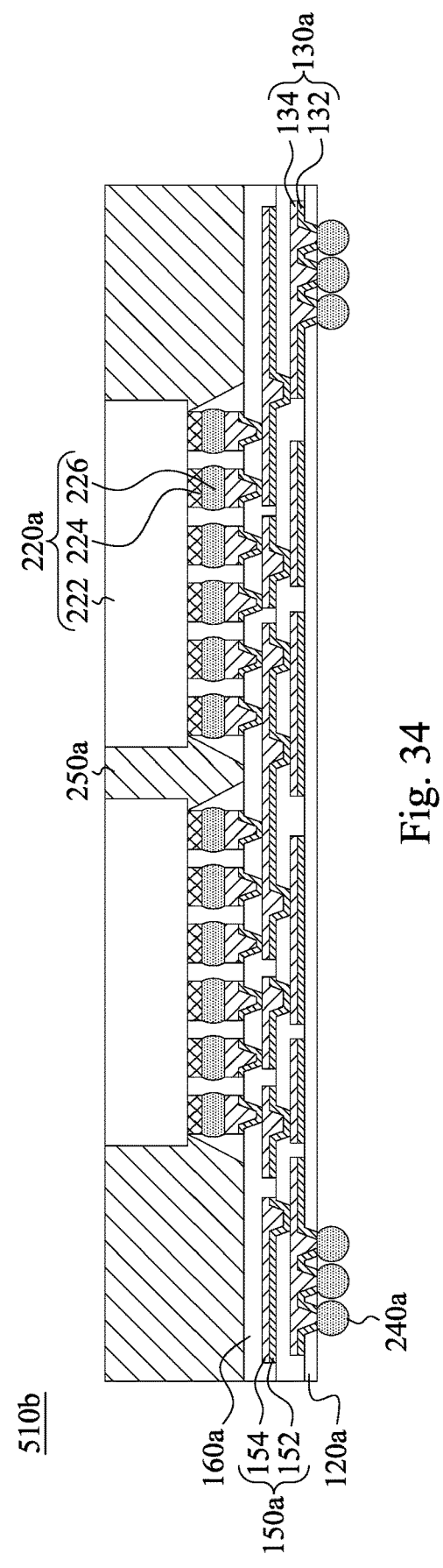
FIG. 34 is a cross-sectional view of a molded package in accordance with some embodiments of the present disclosure.

FIG. 34 is a cross-sectional view of a molded package 510b in accordance with some embodiments of the present disclosure. In some embodiments, the TSV devices 260a of FIG. 29 are optional. The molded package 510b has no TSV device in the molding material 250a, but has more molding material 250a on the dielectric layer 160a to supplement vacancies.

Figure 35:
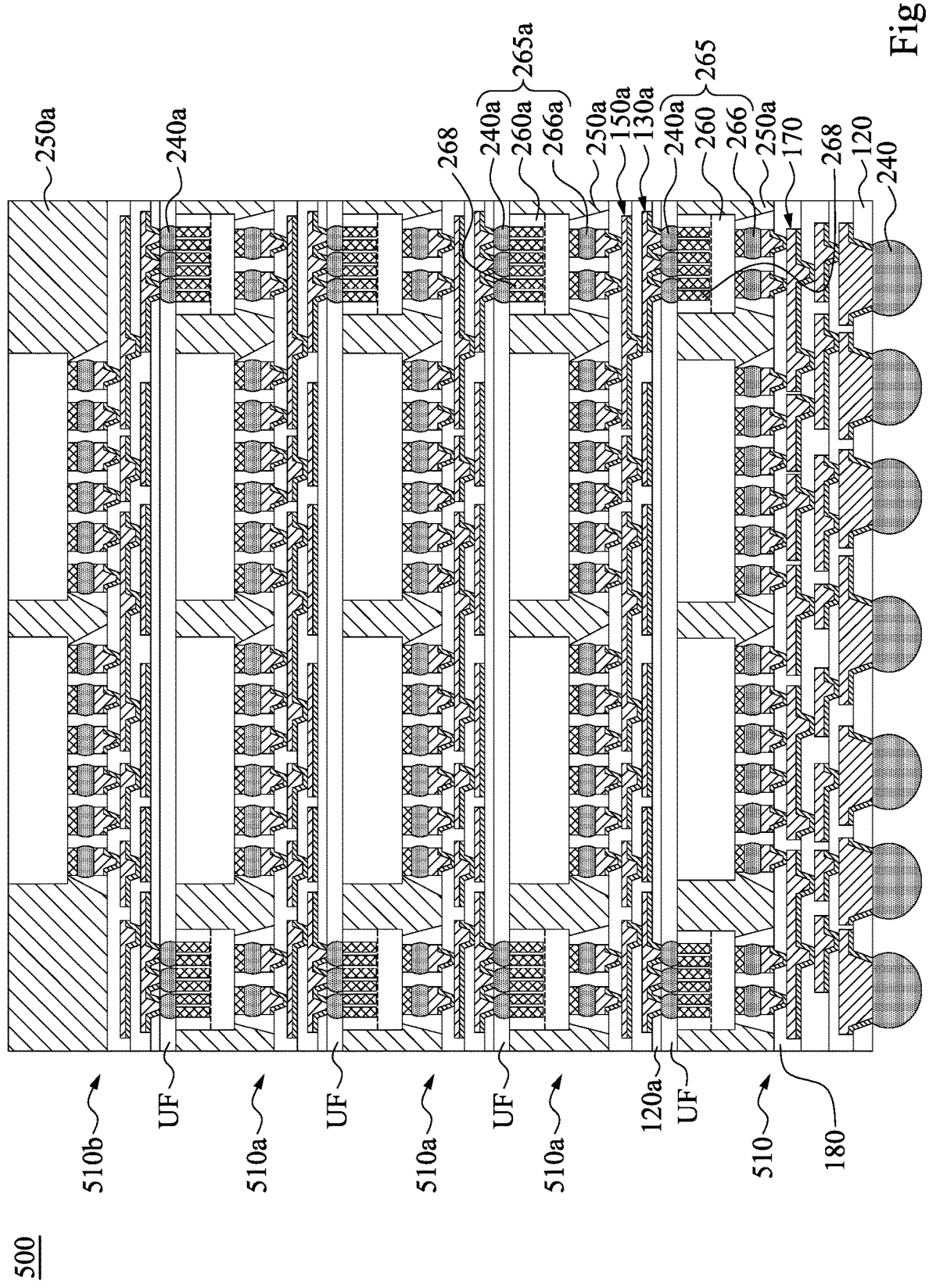
FIG. 35 is a cross-sectional view of a package structure in accordance with some embodiments of the present disclosure.

FIG. 35 is a cross-sectional view of a package structure 500 in accordance with some embodiments of the present disclosure. After the formations of the molded package 510 of FIG. 32, at least one molded package 510a of FIG. 33, and the molded package 510b of FIG. 34, the molded package 510b is bonded to the molded package 510a through the conductive balls 240a of the molded package 510b and the TSV devices 260a of the underlying molded package 510a, and the molded package 510a is bonded to the molded package 510 through the conductive balls 240a of the molded package 510a and the TSV devices 260 of the molded package 510. The conductive balls 240a are between and electrically connect the TSV devices 260 of the molded package 510 and the RDLs 130a of the molded package 510a. Therefore, the conductive balls 240a of the molded package 510b are electrically connected to the TSVs 268 of the TSV devices 260a of the molded package 510a, and the conductive balls 240a of the molded package 510a are electrically connected to the TSVs 268 of the TSV devices 260 of the molded package 510. In other words, the conductive features 265 including the TSV devices 260, the conductive balls 266, and the conductive balls 240a electrically connect the RDLs 130a of the molded package 510a and the RDLs 170 of the molded package 510. In addition, conductive features 265a including the TSV devices 260a, the conductive balls 266a, and the conductive balls 240a electrically connect the RDLs 130a through the RDLs 150a. As a result of such configuration, the molded package 510b is stacked on the molded package 510a, and the molded package 510a is stacked on the molded package 510, thereby forming the package structure 500.

In some embodiments, the TSV devices 260a of the molded package 510a are substantially aligned with the conductive balls 240a of the molded package 510a, and hence at least two molded package 510a can be stacked through the conductive balls 240a of the upper molded package 510a and the TSV devices 260a of the lower molded package 510a. For example, the package structure 500 includes three molded packages 510a, but various embodiments of the present disclosure are not limited in this regard.

In some embodiments, underfills UF are optionally disposed between the molded package 510b and the underlying molded package 510a, between two adjacent molded packages 510a, and between the molded packages 510a and the underlying molded package 510, such that the molded package 510b is securely positioned on the molded package 510a, and the molded package 510a is securely positioned on another molded package 510a or the molded package 510.

Figure 36:
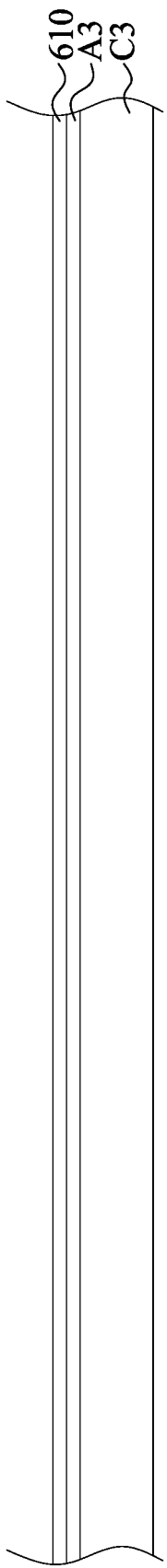
FIGS. 36-51 are cross-sectional views of intermediate stages in the manufacturing of a package structure in accordance with some embodiments of the present disclosure.

FIGS. 36-51 are cross-sectional views of intermediate stages in the manufacturing of a package structure in accordance with some embodiments of the present disclosure. Reference is made to FIG. 36. An adhesive layer A3 is formed on a carrier C3. The carrier C3 may be a blank glass carrier, a blank ceramic carrier, or the like. The adhesive layer A3 may be made of an adhesive, such as ultra-violet (UV) glue, light-to-heat conversion (LTHC) glue, or the like, although other types of adhesives may be used. A buffer layer 610 is formed over the adhesive layer A3. The buffer layer 610 is a dielectric layer, which may be a polymer layer. The polymer layer may include, for example, polyimide, polybenzoxazole (PBO), benzocyclobutene (BCB), an ajinomoto buildup film (ABF), a solder resist film (SR), or the like.

Figure 37:
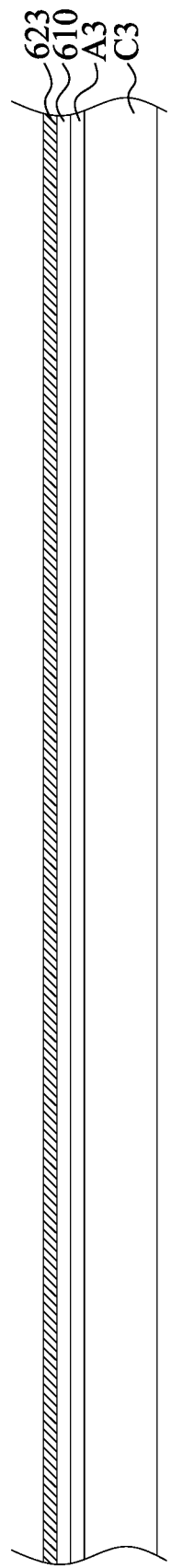

Reference is made to FIG. 37. A seed layer 623 is formed on the buffer layer 610, for example, through physical vapor deposition (PVD) or metal foil laminating. The seed layer 623 may include copper, copper alloy, aluminum, titanium, titanium alloy, or combinations thereof. In some embodiments, the seed layer 623 includes a titanium layer and a copper layer over the titanium layer. In alternative embodiments, the seed layer 623 is a copper layer.

Figure 38:
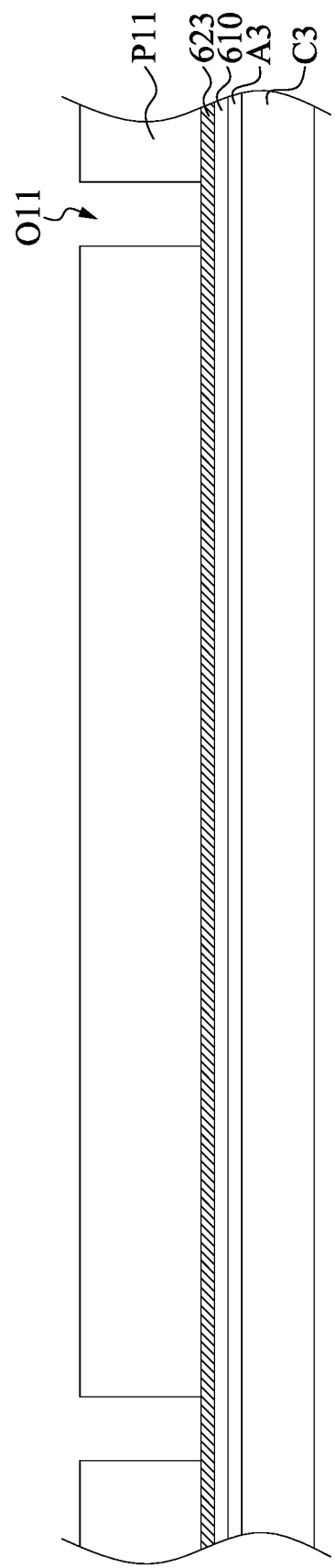

Reference is made to FIG. 38. A photo resist P11 is applied over the seed layer 623 and is then patterned. As a result, openings O11 are formed in the photo resist P11, through which some portions of the seed layer 623 are exposed.

Figure 39:
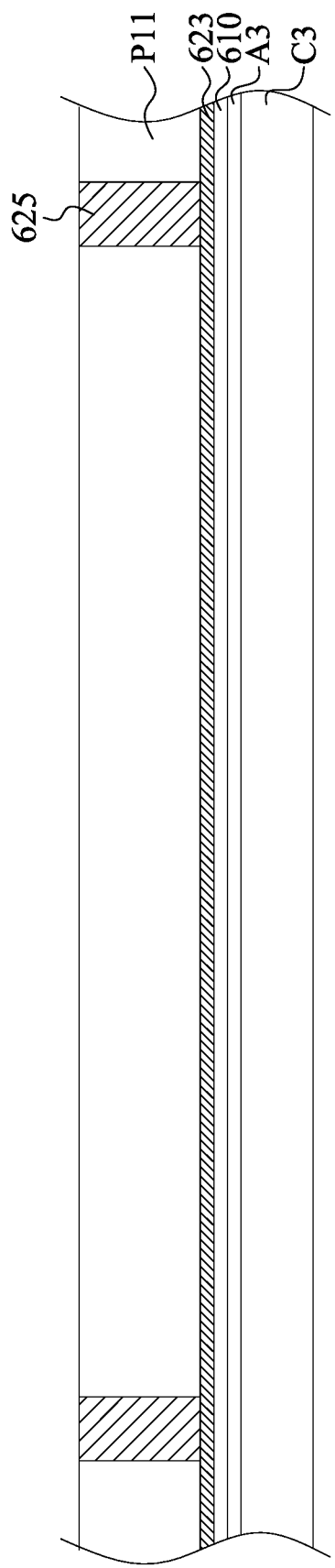
Figure 40:
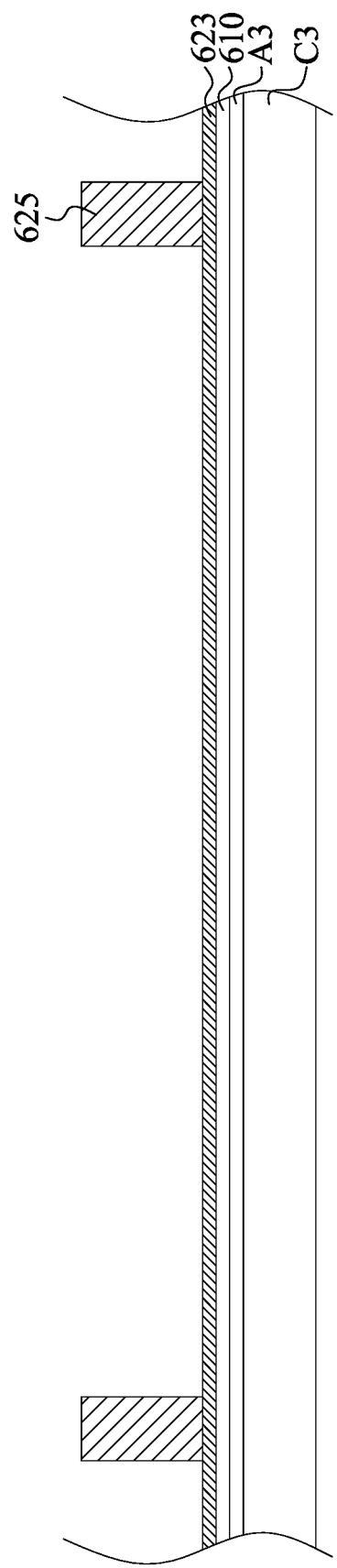

Reference is made to FIG. 39. Conductors 625 are formed in the photo resist P11 through plating, which may be electro plating or electro-less plating. The conductors 625 are plated on the exposed portions of the seed layer 623. The conductors 625 may include copper, aluminum, tungsten, nickel, solder, or alloys thereof. Heights of the conductors 625 are determined by the thickness of subsequently placed semiconductor devices 630 (see FIG. 42), with the heights of the conductors 625 greater than the thickness of the semiconductor devices 630 in some embodiments of the present disclosure. After the plating of the conductors 625, the photo resist P11 is removed, and the resulting structure is shown in FIG. 40. After the photo resist P11 is removed, some portions of the seed layer 623 are exposed.

Figure 41:
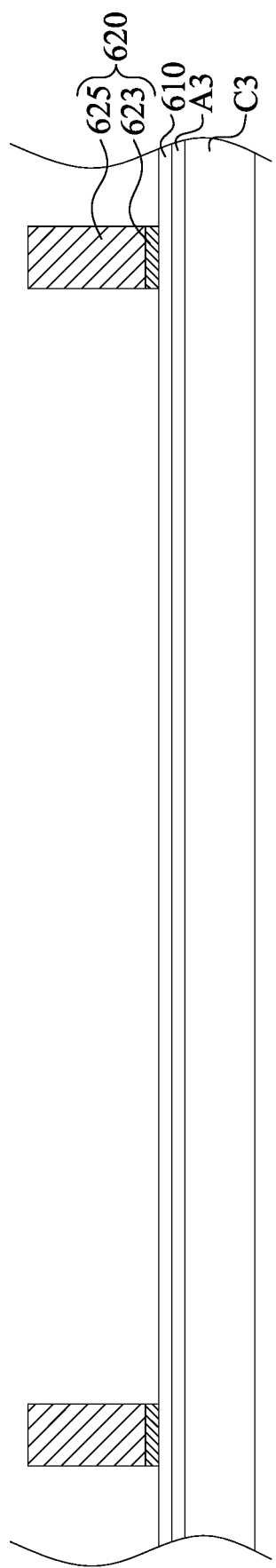

Reference is made to FIG. 41. An etch step is performed to remove the exposed portions of seed layer 623, wherein the etch step may include an anisotropic etching. Some portions of the seed layer 623 that are covered by the conductors 625, on the other hand, remain not etched. Throughout the description, the conductors 625 and the remaining underlying portions of the seed layer 623 are in combination referred to as conductive features 620, which are through integrated fan-out (InFO) vias (TIVs), which are also referred to as through-vias. Although the seed layer 623 is shown as a layer separate from the conductors 625, when the seed layer 623 is made of a material similar to or substantially the same as the respective overlying conductors 625, the seed layer 623 may be merged with the conductors 625 with no distinguishable interface therebetween. In alternative embodiments, there exist distinguishable interfaces between the seed layer 623 and the overlying conductors 625.

Figure 42:
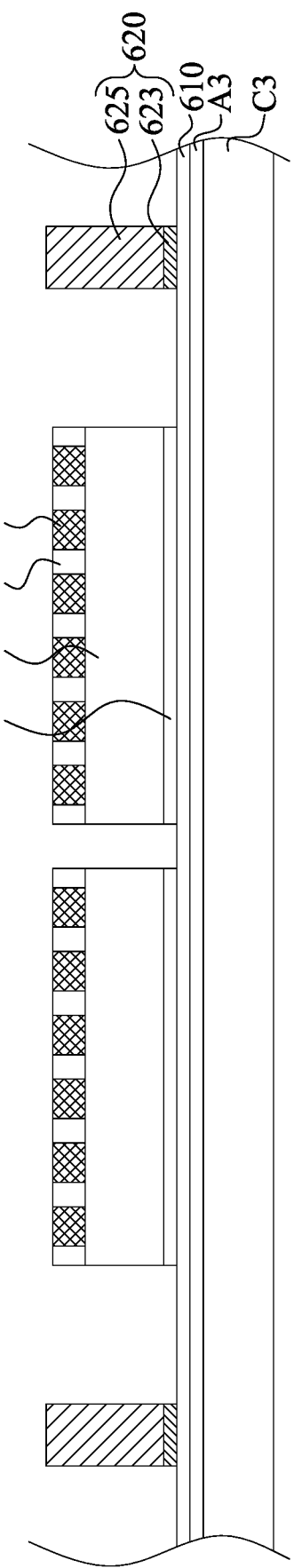

FIG. 42 illustrates placement of the semiconductor devices 630 over the buffer layer 610. The semiconductor devices 630 may be adhered to the buffer layer 610 through adhesive layers 631. In some embodiments, the semiconductor devices 630 are unpackaged semiconductor devices, i.e. device dies. For example, the semiconductor devices 630 may be logic device dies including logic transistors therein. In some embodiments, the semiconductor devices 630 are designed for mobile applications, and may be central computing unit (CPU) dies, power management integrated circuit (PMIC) dies, transceiver (TRX) dies, or the like. Each of the semiconductor devices 630 includes a semiconductor substrate 632 (a silicon substrate, for example) that contacts the adhesive layer 631, wherein the back surface of the semiconductor substrate 632 is in contact with the adhesive layer 631.

In some embodiments, conductive pillars 636 (such as copper posts) are formed as the top portions of the semiconductor devices 630, and are electrically coupled to the devices such as transistors (not shown) in the semiconductor devices 630. In some embodiments, a dielectric layer 634 is formed on the top surface of the respective semiconductor device 630, with the conductive pillars 636 having at least lower portions in the dielectric layer 634. The top surfaces of the conductive pillars 636 may be substantially level with the top surfaces of the dielectric layers 634 in some embodiments. Alternatively, the dielectric layers are not formed, and the conductive pillars 636 protrude from a top dielectric layer (not shown) of the respective semiconductor devices 630.

Figure 43:
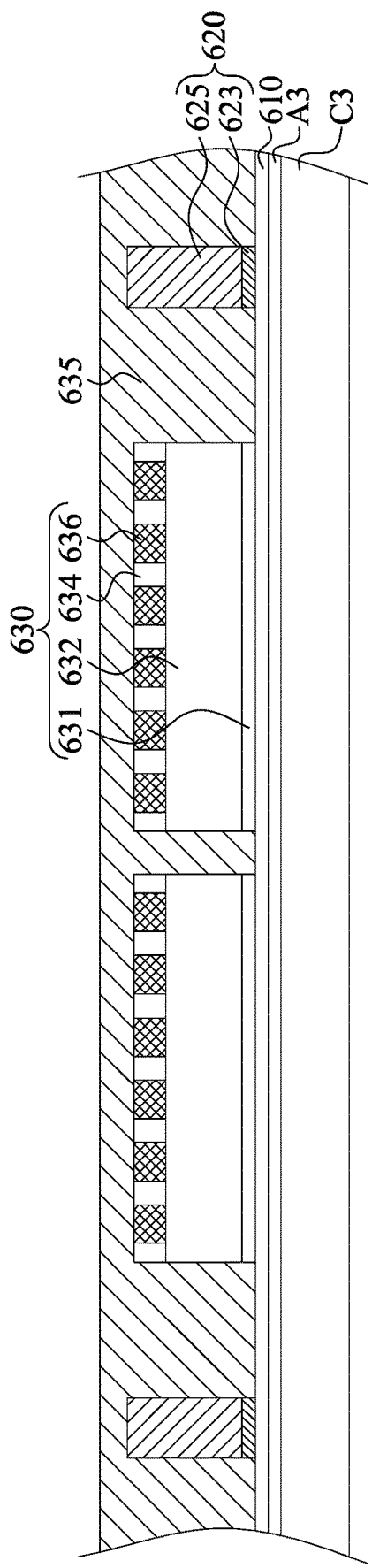

Reference is made to FIG. 43. A molding material 635 is molded on the semiconductor devices 630 and the TIVs 620. The molding material 635 fills gaps between the semiconductor devices 630 and the TIVs 620, and may be in contact with the buffer layer 610. Furthermore, the molding material 635 is filled into gaps between the conductive pillars 636 when the conductive pillars 636 are protruding metal pillars (this arrangement is not shown). The top surface of the molding material 635 is higher than the top ends of the conductive pillars 636 and the TIVs 620.

In some embodiments, the molding material 635 includes a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or any combinations thereof.

Figure 44:
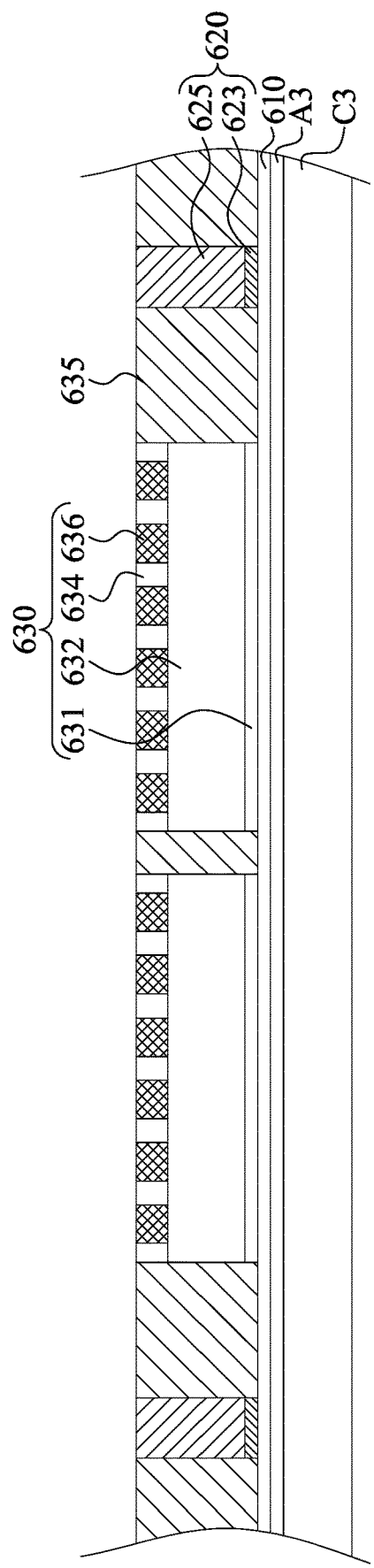

Next, a grinding step is performed to thin the molding material 635, until the conductive pillars 636 and the TIVs 620 are exposed. The resulting structure is shown in FIG. 44, in which the molding material 635 is in contact with sidewalls of the semiconductor devices 630 and the TIVs 620. The molding material 635 surrounds the semiconductor devices 630 and the TIVs 620. Due to the grinding, the top ends of the TIVs 620 are substantially level (coplanar) with the top ends of the conductive pillars 636, and are substantially level (coplanar) with the top surface of the molding material 635. As a result of the grinding, conductive residues such as metal particles may be generated, and left on the top surface of the structure shown in FIG. 44. Accordingly, after the grinding, a cleaning may be performed, for example, through a wet etching, so that the conductive residues are removed.

Figure 45:
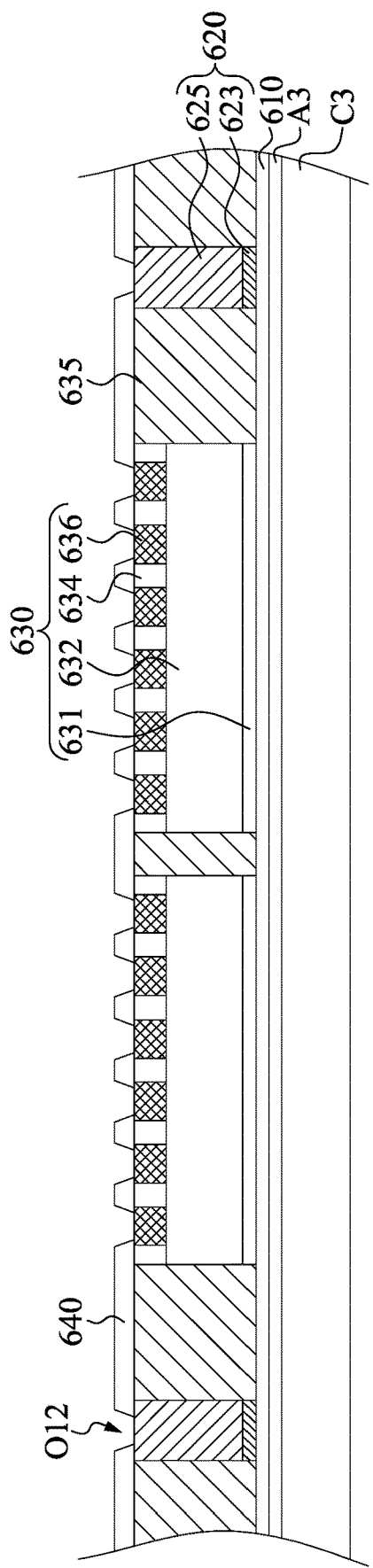

Reference is made to FIG. 45. A dielectric layer 640 is formed over the TIVs 620, the molding material 635, and the semiconductor devices 630. The dielectric layer 640 may include a polymer such as polyimide, benzocyclobutene (BCB), polybenzoxazole (PBO), or the like, which is deposited using a spin coating process or a lamination process, as examples. Alternatively, the dielectric layer 640 may include non-organic dielectric materials such as silicon oxide, silicon nitride, silicon carbide, silicon oxynitride, or the like. The dielectric layer 640 is patterned using a lithography process. For example, a photoresist (not shown) may be formed over the dielectric layer 640, and the photoresist is patterned by exposure to energy or light reflect from or transmitted through a lithography mask having a predetermined pattern thereon. The photoresist is developed, and exposed (or unexposed, depending on whether the photoresist is positive or negative) regions of the photoresist are removed using an ashing and/or etching process. The photoresist is then used as an etch mask during an etch process. Exposed portions of the dielectric layer 640 are removed during the etch process to form openings O12, through which the TIVs 620 and the conductive pillars 636 are exposed. Afterwards, the photoresist is removed.

Figure 46:
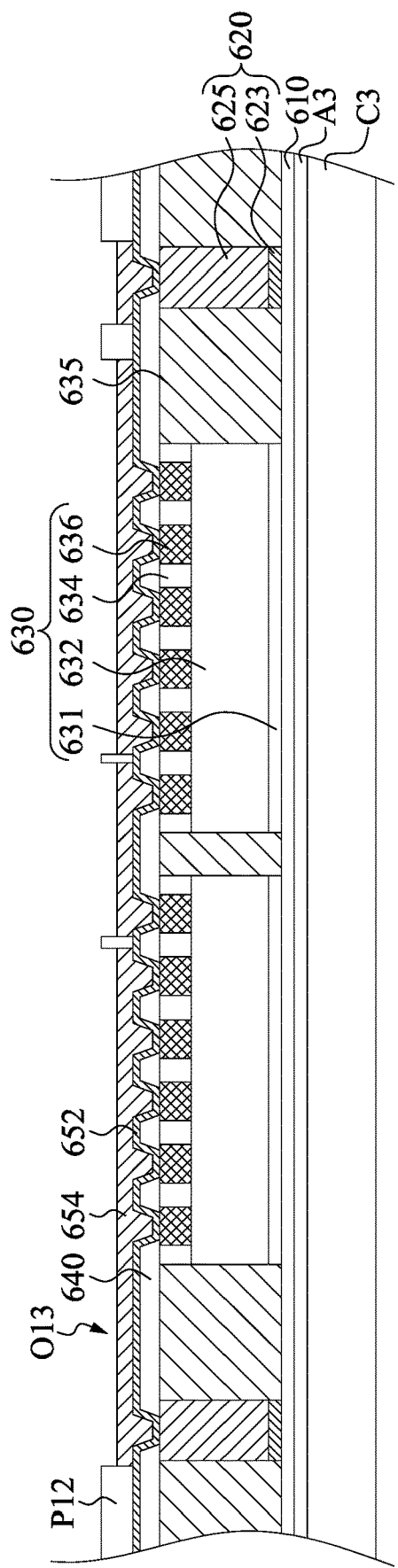

Reference is made to FIG. 46. A seed layer 652 is formed over the dielectric layer 640 and in the openings O12 of the dielectric layer 640. In some embodiments, the seed layer 652 is conformally formed on the dielectric layer 640 and in the openings O12. The seed layer 652 includes about 0.3 μm of a material such as titanium (Ti), copper (Cu), or a combination thereof deposited using PVD or by lamination of a foil material in some embodiments, for example. Alternatively, the seed layer 652 may include other materials and dimensions and may be formed using other methods.

After the formation of the seed layer 652, a photoresist P12 is applied over the seed layer 652 and is then patterned. As a result, openings O13 are formed in the photoresist P12, through which some portions of the seed layer 652 are exposed. The photoresist P12 is patterned using lithography to further define the pattern for conductors 654 formed in a subsequent step. The conductors 654 are respectively formed in the openings O13 of the photoresist P12 through, for example, plating, which may be electro plating or electro-less plating. The conductors 654 are plated on the exposed portions of the seed layer 652. The conductors 654 may include a metal or a metal alloy including aluminum, copper, tungsten, and/or alloys thereof.

Figure 47:
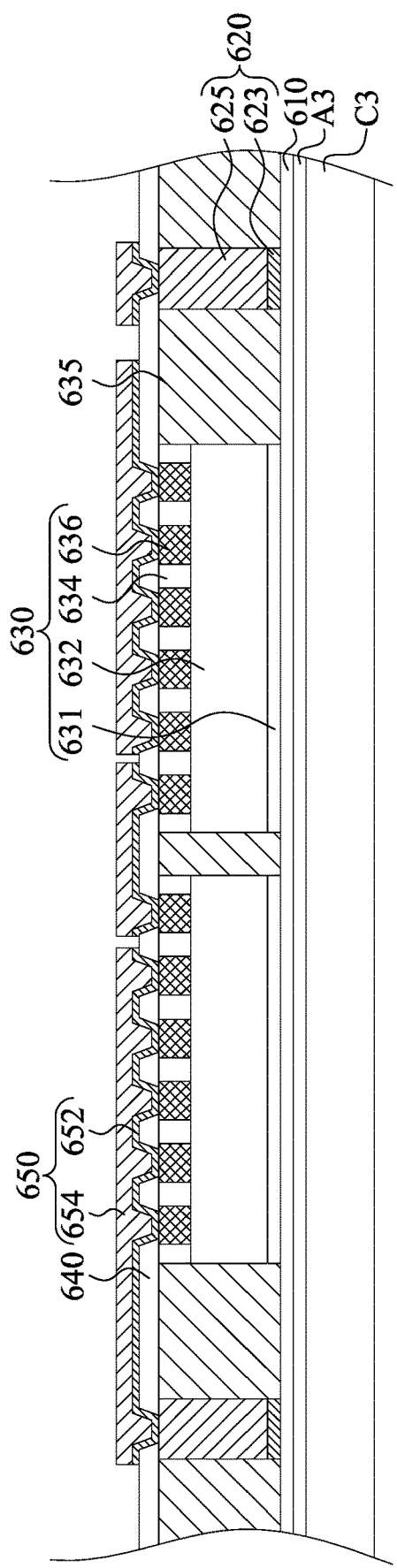

After the plating of the conductors 654, the photoresist P12 is removed, and some portions of the seed layer 652 are exposed. An etch step can be performed to remove the exposed portions of the seed layer 652, and the etch step may include an anisotropic etching. Some portions of the seed layer 652 that are covered by the conductors 654, on the other hand, remain not etched, and the resulting structure is shown in FIG. 47. The conductors 654 and remaining portions of the seed layer 652 can be collectively referred to as redistribution lines (RDLs) 650. Although the seed layer 652 is shown as a layer separate from the conductors 654, when the seed layer 652 is made of a material similar to or substantially the same as the respective overlying conductors 654, the seed layer 652 may be merged with the conductors 654 substantially free from distinguishable interface therebetween. In alternative embodiments, there exist distinguishable interfaces between the seed layer 652 and the overlying conductors 654.

Figure 48:
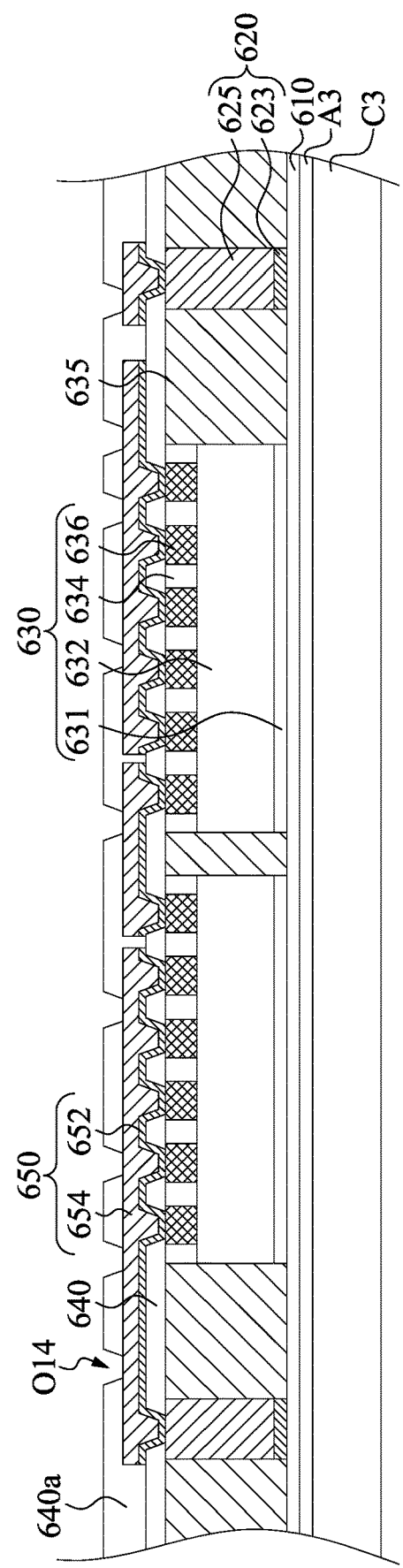

Reference is made to FIG. 48. A dielectric layer 640a is formed over the RDLs 650 and the dielectric layer 640 such that the RDLs 650 are embedded in the dielectric layer 640a. The dielectric layer 640a may include a polymer such as polyimide, benzocyclobutene (BCB), polybenzoxazole (PBO), or the like, which is deposited using a spin coating process or a lamination process, as examples. Alternatively, the dielectric layer 640a may include non-organic dielectric materials such as silicon oxide, silicon nitride, silicon carbide, silicon oxynitride, or the like. The dielectric layer 640a is patterned using a lithography process. For example, a photoresist (not shown) may be formed over the dielectric layer 640a, and the photoresist is patterned by exposure to energy or light reflect from or transmitted through a lithography mask having a predetermined pattern thereon. The photoresist is developed, and exposed (or unexposed, depending on whether the photoresist is positive or negative) regions of the photoresist are removed using an ashing and/or etching process. The photoresist is then used as an etch mask during an etch process. Exposed portions of the dielectric layer 640a are removed during the etch process to form openings O14, through which some portions of the RDLs 650 are exposed.

Figure 49:
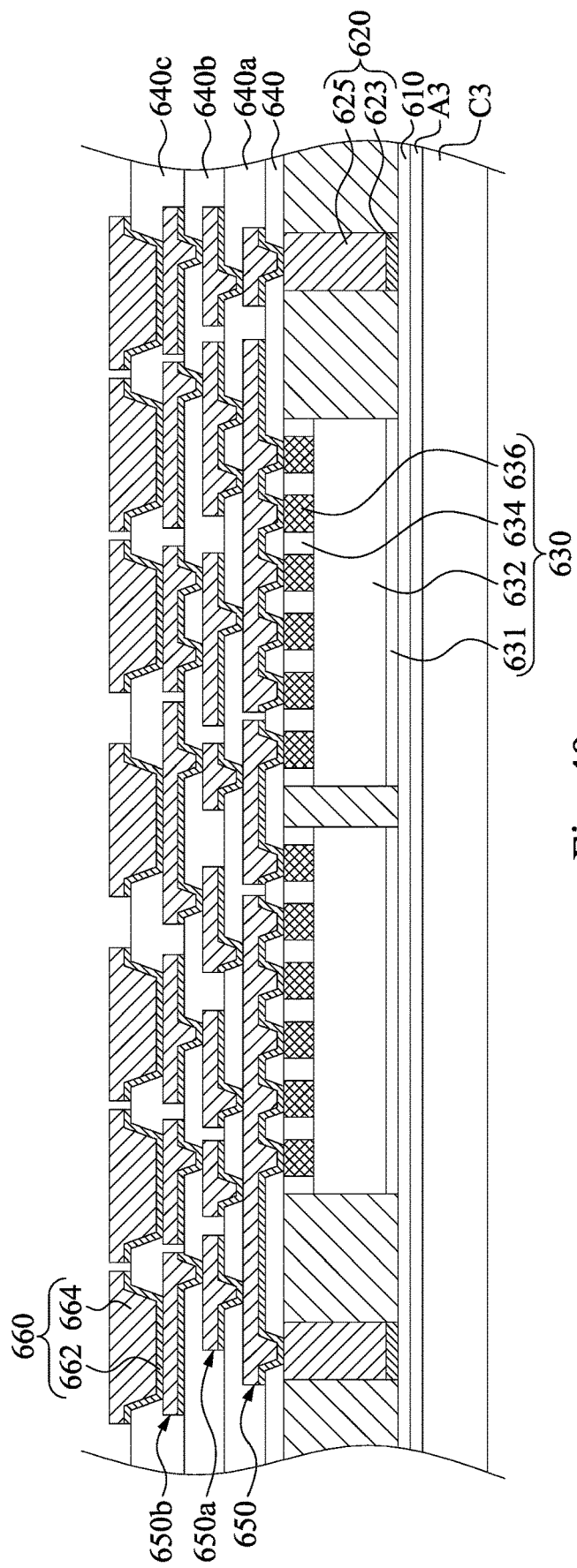

The number of layers of RDLs and the number of dielectric layers are not limited in various embodiments of the present disclosure. For example, after the structure of FIG. 48 is formed, layers of RDLs 650a, 650b and dielectric layers 640b, 640c as illustrated in FIG. 49, may be formed over the RDLs 650 and the dielectric layer 640a through the aforementioned steps from FIG. 45 to FIG. 48. In order to simplify the description, the steps for forming the RDLs 650a, 650b and the dielectric layers 640b, 640c will not described again. Moreover, the formation of contact pads 660 of FIG. 49 is similar to the steps from FIG. 3 to FIG. 5.

Reference is made to FIG. 49. After the dielectric layer 640c is patterned to form openings, a seed layer 662 is formed over the dielectric layer 640c and exposed portions of the RDLs 650b in the openings, and then a photoresist is applied over the seed layer 662 and is patterned to form openings. Next, conductors 664 are respectively formed in the openings of the photoresist through plating, such that the conductors 664 are plated on the exposed portions of the seed layer 662. After the plating of the conductors 664, the photoresist is removed to expose some portions of the seed layer 662, and then an etch operation is performed to remove the exposed portions of the seed layer 662. As a result, the conductors 664 and the remaining underlying portions of the seed layer 662 are in combination referred to as the contact pads 660 of FIG. 49.

Although the seed layer 662 is shown as a layer separate from the conductors 664, when the seed layer 662 is made of a material similar to or substantially the same as the respective overlying conductors 664, the seed layer 662 may be merged with the conductors 664 substantially free from distinguishable interface therebetween. In alternative embodiments, there exist distinguishable interfaces between the seed layer 662 and the overlying conductors 664.

Figure 50:
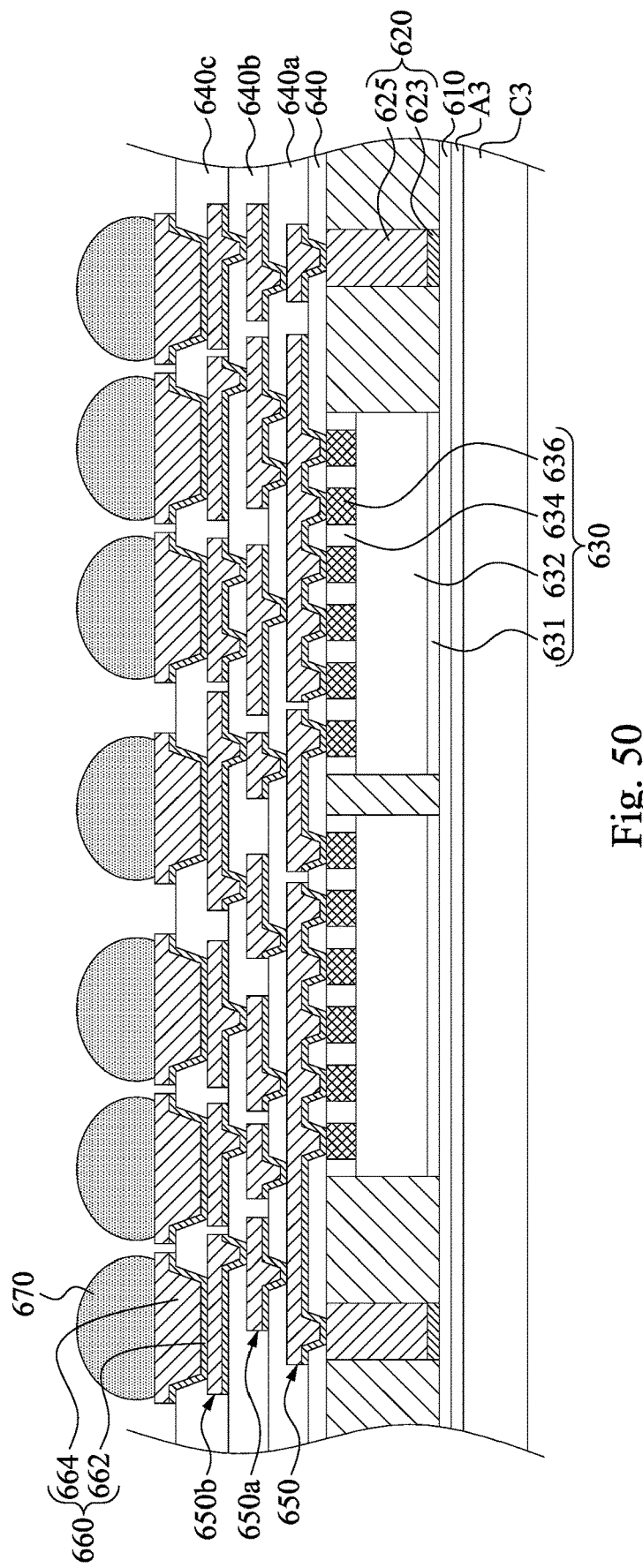

Reference is made to FIG. 50. Conductive bumps, such as the conductive balls 670, are formed on the contact pads 660. In other words, the conductive balls 670 are respectively in contact with the contact pads 660, so that the conductive balls 670 can be electrically connected to the contact pads 660. As such, the conductive balls 670 can be electrically coupled to the RDLs 650, 650a, 650b via the contact pads 660. After the conductive balls 670 are formed, the carrier C3 and the adhesive layer A3 are removed from the buffer layer 610.

Figure 51:
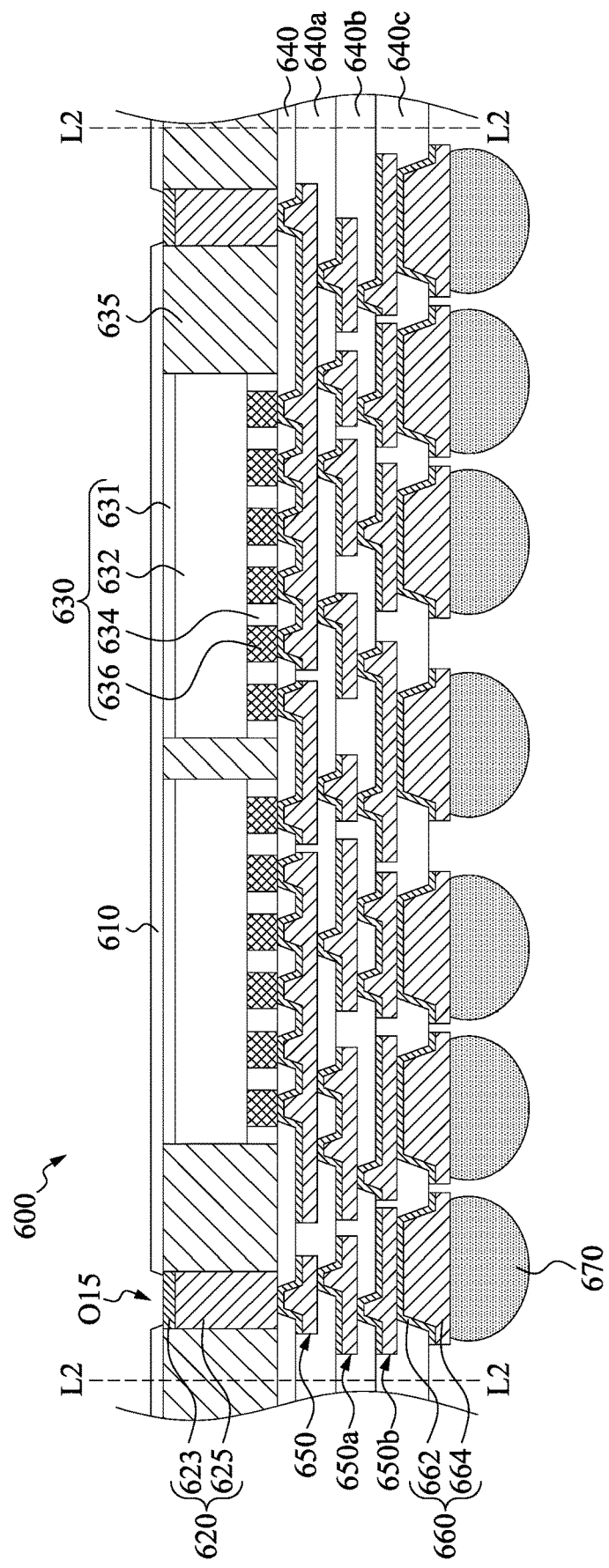
Figure 52:
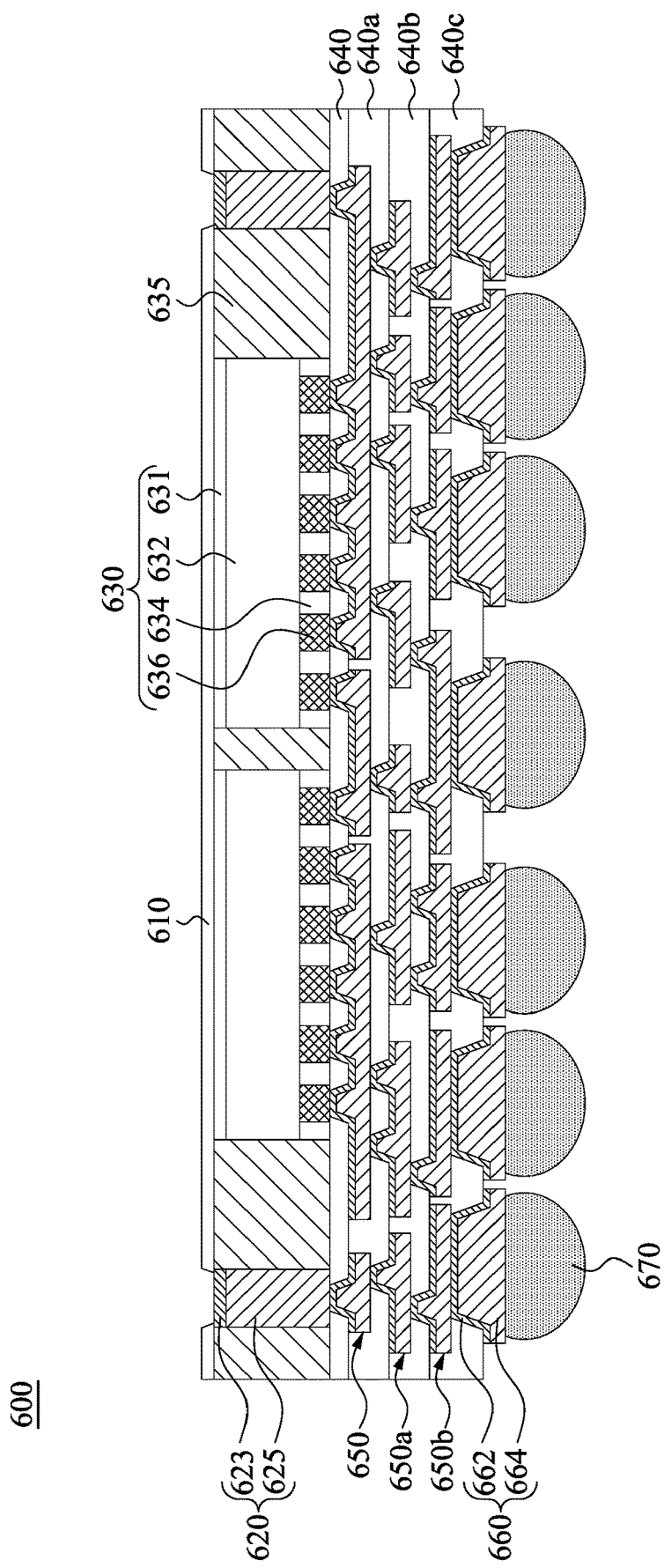
FIG. 52 is a cross-sectional view of a TIV package in accordance with some embodiments of the present disclosure.

Reference is made to FIG. 51. As a result of the debonding from the carrier C3 and removal of the adhesive layer A3, the buffer layer 610 over the semiconductor devices 630 and the molding material 635 is exposed. The buffer layer 610 is then patterned to form openings O15 and hence the TIVs 620 are exposed. In some embodiments, a laser drilling process is performed to form the openings O15. In some other embodiments, photolithography processes may also be used to form the openings O15 and remove portions of the buffer layer 610. In some embodiments, the structure shown in FIG. 50 can be adhered to a dicing tape (not shown) after the de-bonding from the carrier C3. Next, a singulation process is carried out to saw the buffer layer 610, the molding material 635, and the dielectric layers 640, 640a-640c along lines L2, such that plural chip-scale TIV packages 600 may be formed, and the resulting structure is shown in FIG. 52.

Figure 53:
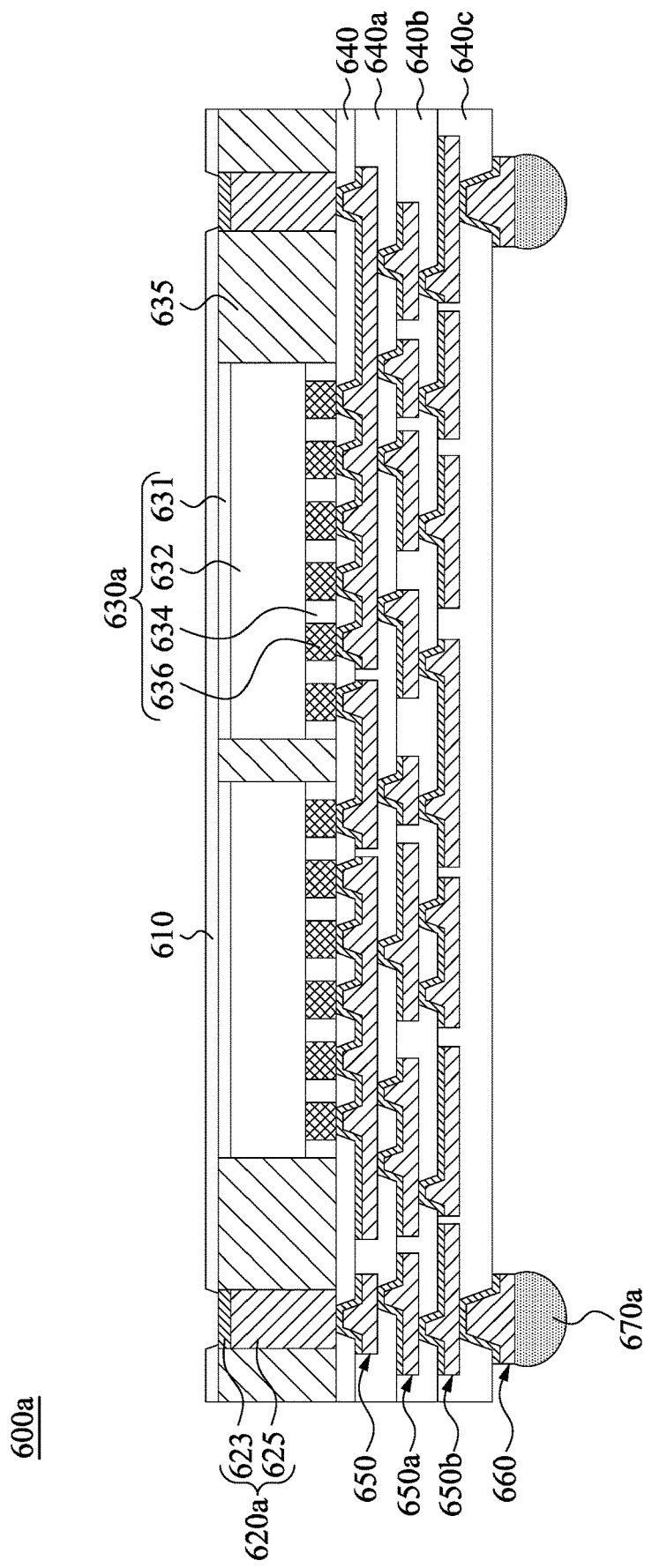
FIG. 53 is a cross-sectional view of a TIV package in accordance with some embodiments of the present disclosure.

FIG. 53 is a cross-sectional view of a TIV package 600a in accordance with some embodiments of the present disclosure. The TIV package 600a may be formed by aforementioned manufacturing steps of the TIV package 600 of FIG. 52. Compared with the TIV package 600, the TIV package 600a has less conductive balls 670a. In some embodiments, the TIV package 600a includes semiconductor devices 630a the same as the semiconductor devices 630 of FIG. 52. In alternative embodiments, the semiconductor devices 630a of FIG. 53 are different from the semiconductor devices 630 of FIG. 52, and various embodiments of the present disclosure are not limited in this regard.

Figure 54:
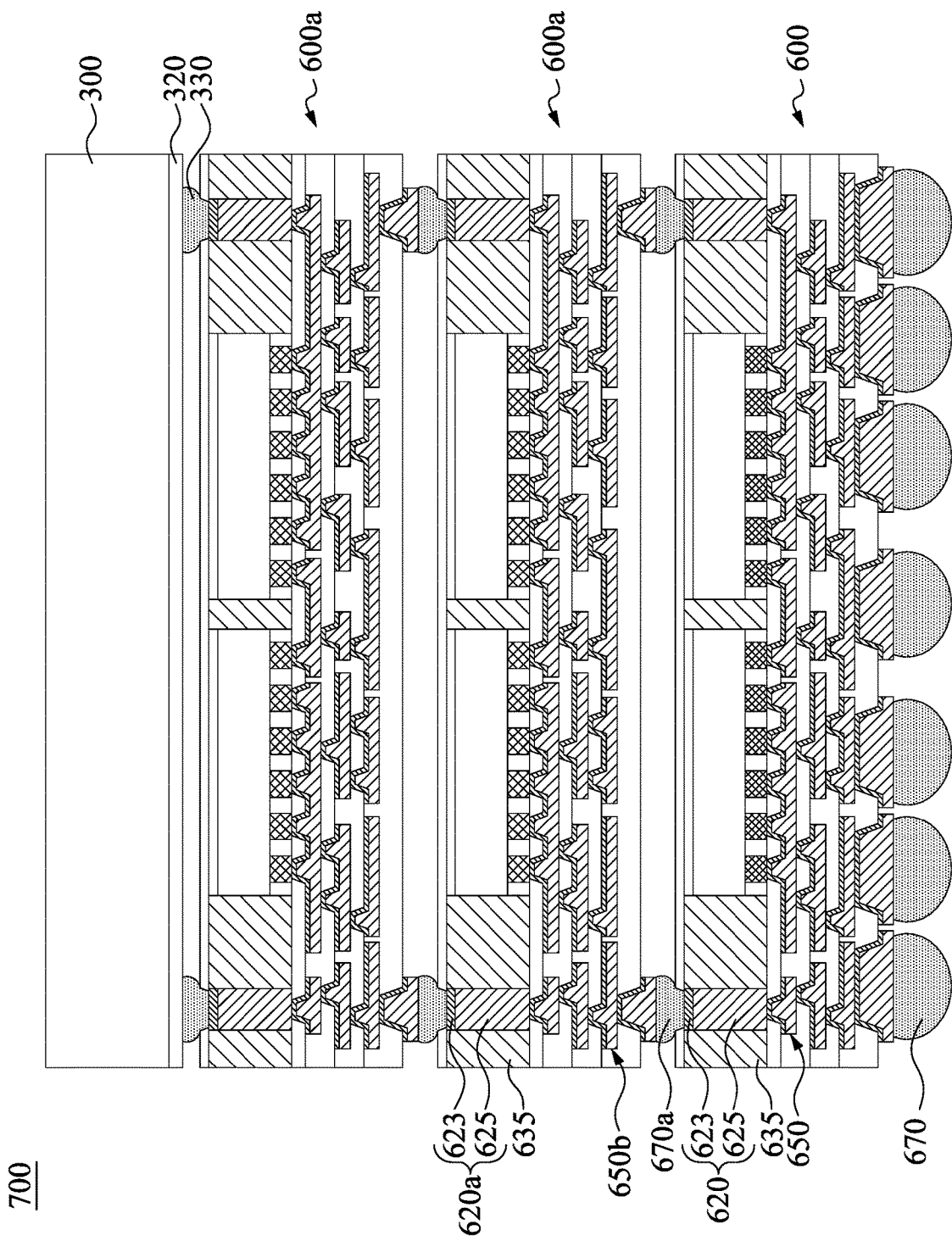
FIG. 54 is a cross-sectional view of a package structure in accordance with some embodiments of the present disclosure.

FIG. 54 is a cross-sectional view of a package structure 700 in accordance with some embodiments of the present disclosure. After the formations of the TIV package 600 of FIG. 52 and at least one TIV package 600a of FIG. 53, the TIV package 600a is bonded to the TIV package 600 through the conductive balls 670a of the TIV package 600a. The conductive balls 670a are between the RDLs 650b of the TIV package 600a and the TIVs 620 of the TIV package 600 and free from the molding material 635. The conductive balls 670a of the TIV package 600a are respectively substantially aligned with the TIVs 620 of the TIV package 600 that are respectively exposed through the openings O15 (see FIG. 51). As a result, the TIV package 600a can be stacked on the TIV package 600. In some embodiments, in the TIV package 600a, the TIVs 620a are respectively substantially aligned with the conductive balls 670a. As a result of such configuration, at least two TIV packages 600a can be stacked through the conductive balls 670a of the upper TIV packages 600a and the exposed TIVs 620a of the lower TIV packages 600a. In some embodiments, an underfill can be disposed between neighboring TIV packages and enclosing the conductive balls 670a.

After the TIV packages 600a are bonded to the TIV package 600, a semiconductor package 300 is bonded to the upper TIV package 600a. In some embodiments, the semiconductor package 300 includes the buffer layer 320 and the conductive balls 330. The conductive balls 330 protrude from the buffer layer 320. In addition, the conductive balls 330 of the semiconductor package 300 are substantially aligned with the TIVs 620a of the upper TIV package 600a, respectively. In such configuration, the semiconductor package 300 can be bonded to the upper TIV package 600a through the conductive balls 330 at the bottom side of the semiconductor package 300 and the TIVs 620a at the top side of the upper TIV package 600a. However, various embodiments of the present disclosure are not limited to the sequence of the aforementioned steps. For example, the TIV packages 600a are jointed to form a stacked structure, and then the semiconductor package 300 is bonded to the top side of the stacked structure. Thereafter, the lower side of the stacked structure is bonded to the TIV package 600, such that the package structure 700 of FIG. 54 may be also obtained. In some embodiments, the semiconductor package 300 may be memory devices, such as a static random access memory (SRAM) or dynamic random access memory (DRAM) device. The semiconductor package 300 may include a plurality of stacked memory dies therein. Moreover, other types of the semiconductor package 300 may be present on the TIV package 600a as well, and various embodiments of the present disclosure are not limited in this regard.

In the aforementioned package structure, since the package structure is a three-dimensional package on package (POP) structure, performance of a system on which the package structure is disposed may be improved due to short-length and high-bandwidth communications among the TIV packages and the semiconductor package. Moreover, the package structure may include various semiconductor devices and the semiconductor package, so as to be flexibly used by designers.

According to some embodiments, a package structure includes a first dielectric layer, a first semiconductor device over the first dielectric layer, a first redistribution line in the first dielectric layer, a second dielectric layer over the first semiconductor device, a second semiconductor device over the second dielectric layer, a second redistribution line in the second dielectric layer, a conductive through-via over the first dielectric layer and electrically connected to the first redistribution line, a conductive ball over the conductive through-via and electrically connected to the second redistribution line, and a molding material. The molding material surrounds the first semiconductor device, the conductive through-via, and the conductive ball, wherein a top of the conductive ball is higher than a top of the molding material.

According to some embodiments, a package structure includes a first dielectric layer, a first semiconductor device over the first dielectric layer, a first redistribution line in the first dielectric layer, a conductive through-via over the first dielectric layer and electrically connected to the first redistribution line, a molding material surrounding the first semiconductor device and the conductive through-via, a conductive ball over the conductive through-via, a second dielectric layer over the molding material, a second semiconductor device over the second dielectric layer, a second redistribution line in the second dielectric layer and electrically connected to the conductive ball, and a buffer layer in contact with the conductive ball and spaced apart from the second dielectric layer.

According to some embodiments, a method includes forming a first conductive through-via over a first buffer layer; disposing a first semiconductor device over the first buffer layer; forming a first molding material to surround the first semiconductor device and the first conductive through-via; forming a first redistribution line electrically connected to a first end of the first conductive through-via and the first semiconductor device, such that the first buffer layer, the first conductive through-via, the first semiconductor device, the first molding material, and the first redistribution line form a first package; forming a first conductive ball over and electrically connected to the first redistribution line; forming a second conductive through-via over a second buffer layer; disposing a second semiconductor device over the second buffer layer; forming a second molding material to surround the second semiconductor device and the second conductive through-via; forming a second redistribution line electrically connected to a first end of the second conductive through-via and the second semiconductor device, such that the second buffer layer, the second conductive through-via, the second semiconductor device, the second molding material, and the second redistribution line form a second package; forming a second conductive ball over and electrically connected to the second redistribution line; flipping the first package; after flipping the first package, forming an opening in the first buffer layer to expose a second end of the first conductive through-via; flipping the second package; and after flipping the second package, stacking the second package over the first package such that the second conductive ball is over and electrically connected to the second end of the first conductive through-via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first dielectric layer;
   a first semiconductor device over the first dielectric layer;
   a first redistribution line in the first dielectric layer;
   a second dielectric layer over the first semiconductor device;
   a second semiconductor device over the second dielectric layer;
   a second redistribution line in the second dielectric layer;
   a conductive through-via over the first dielectric layer, wherein the conductive through-via has a top at a position lower than a top surface of the first semiconductor device;
   a conductive ball over the conductive through-via;
   a molding material surrounding the first semiconductor device, the conductive through-via, and the conductive ball, wherein a top of the conductive ball is higher than a top surface of the molding material; and
   a buffer layer on the top surface of the molding material, wherein the top of the conductive ball is higher than a top of the buffer layer.

2. The package structure of claim 1, wherein the conductive through-via has the top below the buffer layer.

3. The package structure of claim 1, wherein the buffer layer has a bottom higher than a top surface of the first semiconductor device.

4. The package structure of claim 1, wherein the molding material interfaces a top surface of the first semiconductor device.

5. The package structure of claim 1, wherein the first semiconductor device is spaced apart from the conductive ball by the molding material.

6. The package structure of claim 1, wherein the buffer layer laterally surrounds a portion of the conductive ball.

7. The package structure of claim 1, wherein a sidewall of the conductive ball has an upper portion interfacing the buffer layer and a lower portion interfacing the molding material.

8. The package structure of claim 1, wherein an interface formed by the conductive ball and the buffer layer is smaller than an interface formed by the conductive ball and the molding material.

9. The package structure of claim 8, wherein from a cross-sectional view, the interface formed by the conductive ball and the buffer layer has a curve continuously extending from a curve of the interface formed by the conductive ball and the molding material.

10. A package structure, comprising:
    a first dielectric layer;
    a first semiconductor device above the first dielectric layer;
    a first through-semiconductor-via (TSV) device above the first dielectric layer, the first TSV device comprising a first semiconductor substrate and a plurality of first TSVs extending through the first semiconductor substrate;
    a second dielectric layer above the first dielectric layer, the first semiconductor device, and the TSV device;
    a second semiconductor device above the second dielectric layer;
    a redistribution line in the second dielectric layer and electrically connected to the second semiconductor device;
    a conductive bump electrically connecting the redistribution line and the TSVs of the TSV device;
    a first molding material molding the first semiconductor device and the TSV device, wherein the first molding material has a top surface not higher than top ends of the plurality of first TSVs; and
    a second molding material molding the second semiconductor device.

11. The package structure of claim 10, further comprising:
    a second TSV device molded within the second molding material, the second TSV device comprising a second semiconductor substrate and a plurality of second TSVs extending through the second semiconductor substrate.

12. The package structure of claim 11, wherein the first TSV device vertically overlaps the second TSV device.

13. The package structure of claim 10, wherein two of the plurality of first TSVs are in contact with the conductive bump.

14. The package structure of claim 10, wherein the conductive bump has a bottom surface extending across two of the plurality of first TSVs.

15. The package structure of claim 14, wherein the bottom surface of the conductive bump is substantially planar.

16. The package structure of claim 10, wherein the top surface of the first molding material is level with the top ends of the plurality of first TSVs.

17. A package structure, comprising:
    a first dielectric layer;
    a first semiconductor device over the first dielectric layer;
    a first redistribution line in the first dielectric layer;
    a first molding material surrounding the first semiconductor device;
    a conductive ball over the first molding material;
    a second dielectric layer over the conductive ball;
    a second semiconductor device over the second dielectric layer;
    a second redistribution line in the second dielectric layer and electrically connected to the conductive ball;
    a conductive through-via over the second dielectric layer;
    a second molding material surrounding the second semiconductor device and the conductive through-via; and a buffer layer on a top surface of the first molding material, wherein the conductive ball extends upward through the buffer layer to a position below a bottom surface of the second dielectric layer.

18. The package structure of claim 17, wherein the conductive ball has a bottom surface level with a top surface of the first molding material.

19. The package structure of claim 17, wherein a sidewall of the conductive ball is more curved above the buffer layer than in the buffer layer.

20. The package structure of claim 17, wherein the conductive through-via over the second dielectric layer vertically overlaps the conductive ball.

* * * * *